(12) United States Patent
Ono et al.

(10) Patent No.: US 11,860,248 B2
(45) Date of Patent: Jan. 2, 2024

(54) METHOD FOR MEASURING MAGNETIC CHARACTERISTICS, APPARATUS FOR MEASURING MAGNETIC CHARACTERISTICS, AND METHOD FOR MANUFACTURING MAGNETIC RECORDING MEDIUM

(71) Applicant: Sony Corporation, Tokyo (JP)

(72) Inventors: Akifumi Ono, Tokyo (JP); Yasunori Imai, Tokyo (JP)

(73) Assignee: Sony Corporation, Tokyo (JP)

( * ) Notice: Subject to any disclaimer, the term of this patent is extended or adjusted under 35 U.S.C. 154(b) by 382 days.

(21) Appl. No.: 17/277,190

(22) PCT Filed: Sep. 13, 2019

(86) PCT No.: PCT/JP2019/036123
§ 371 (c)(1),
(2) Date: Feb. 1, 2022

(87) PCT Pub. No.: WO2020/059662
PCT Pub. Date: Mar. 26, 2020

(65) Prior Publication Data
US 2022/0221531 A1 Jul. 14, 2022

(30) Foreign Application Priority Data
Sep. 18, 2018 (JP) ................. 2018-174246

(51) Int. Cl.
*G01R 33/032* (2006.01)
*G01N 27/72* (2006.01)
*G01R 33/12* (2006.01)

(52) U.S. Cl.
CPC ......... *G01R 33/0325* (2013.01); *G01N 27/72* (2013.01); *G01R 33/1223* (2013.01)

(58) Field of Classification Search
CPC ............ G01R 33/0325; G01R 33/1223; G01R 33/1207; G01N 27/72; G11B 5/84
See application file for complete search history.

(56) References Cited

U.S. PATENT DOCUMENTS 11,037,611 B2 * 6/2021 Noh ........................ H10B 61/00
11,237,224 B2 * 2/2022 Noh ........................ H01L 22/14

FOREIGN PATENT DOCUMENTS

JP S58-215730 A 12/1983
JP S61-255534 A 11/1986
(Continued)

OTHER PUBLICATIONS

International Search Report dated Oct. 15, 2019 in connection with PCT/JP2019/036123.

*Primary Examiner* — Seung C Sohn
(74) *Attorney, Agent, or Firm* — K&L Gates LLP

(57) ABSTRACT

A method for measuring magnetic characteristics is the method including applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected, applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected, applying a third magnetic field having an opposite direction of the second magnetic field to the continuously moving magnetic recording medium, applying a third polarized light to the surface (Continued)

of the magnetic recording medium to which the third magnetic field is being applied, and measuring a light polarization state of a third reflected light that is reflected, and adjusting a strength of the third magnetic field so that a measurement value of the light polarization state of the third reflected light is a mean value of a measurement value of the light polarization state of the first reflected light and a measurement value of the light polarization state of the second reflected light, and obtaining the strength of the third magnetic field when the measurement value of the light polarization state of the third reflected light becomes equal to the mean value.

16 Claims, 7 Drawing Sheets

(56) References Cited

FOREIGN PATENT DOCUMENTS

| | | |
|---|---|---|
| JP | S62-093676 A | 4/1987 |
| JP | 2001-014659 A | 1/2001 |

* cited by examiner

METHOD FOR MEASURING MAGNETIC CHARACTERISTICS, APPARATUS FOR MEASURING MAGNETIC CHARACTERISTICS, AND METHOD FOR MANUFACTURING MAGNETIC RECORDING MEDIUM

TECHNICAL FIELD

The present disclosure relates to a method for measuring magnetic characteristics, an apparatus for measuring magnetic characteristics, and a method for manufacturing a magnetic recording medium.

BACKGROUND ART

In a magnetic recording medium typified by a hard disk or a magnetic tape, the vibrating sample magnetometry method (the VSM method) is used to measure magnetic characteristics such as coercive force, saturation magnetization, or residual magnetization. This method is so widely used as to be regarded as an industry standard; however, this is a destructive measurement method in which a measurement sample needs to be processed to a certain size and be set on a measurement machine, and cannot obtain a measurement result rapidly in a production line. In contrast, there is known a non-contact measurement technique using the magnetic Kerr effect (for example, see Patent Documents 1 and 2), in which non-destructive, non-contact measurement can be performed on a measurement sample. For example, in a state where a measurement sample is kept at a standstill, a change of the light polarization state based on the magnetic Kerr effect is caught while the applied external magnetic field is continuously changed; thereby, the coercive force, the squareness ratio, etc. can be indirectly measured.

CITATION LIST

Patent Document

Patent Document 1: Japanese Patent Application Laid-Open No. H2-310446
Patent Document 2: Japanese Patent Application Laid-Open No. S61-005461

SUMMARY OF THE INVENTION

Problems to be Solved by the Invention

However, in a process in which a magnetic recording medium such as a magnetic tape is produced while being continuously moved, it is difficult to measure the same place while keeping the measurement portion at a standstill and continuously changing the applied external magnetic field. Therefore, it has been impossible to rapidly measure magnetic characteristics such as coercive force while continuing production, and quick feedback to the process has been impossible.

An object of the present disclosure is to provide a method for measuring magnetic characteristics that can measure magnetic characteristics of a continuously moving magnetic recording medium, an apparatus for measuring magnetic characteristics, and a method for manufacturing a magnetic recording medium.

Solutions to Problems

In order to solve the above issues, a first disclosure is a method for measuring magnetic characteristics, the method including:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying a third magnetic field having an opposite direction of the second magnetic field to the continuously moving magnetic recording medium, applying a third polarized light to the surface of the magnetic recording medium to which the third magnetic field is being applied, and measuring a light polarization state of a third reflected light that is reflected; and adjusting a strength of the third magnetic field so that a measurement value of the light polarization state of the third reflected light is a mean value of a measurement value of the light polarization state of the first reflected light and a measurement value of the light polarization state of the second reflected light, and obtaining the strength of the third magnetic field when the measurement value of the light polarization state of the third reflected light becomes equal to the mean value.

A second disclosure is
an apparatus for measuring magnetic characteristics, the apparatus including:

a first measurement section configured to apply a first magnetic field to a continuously moving magnetic recording medium to magnetically saturate the magnetic recording medium, apply a first polarized light to a surface of the magnetic recording medium to which the first magnetic field is being applied, and measure a light polarization state of a first reflected light that is reflected;

a second measurement section configured to apply a second magnetic field having an opposite direction of the first magnetic field to the continuously moving magnetic recording medium to magnetically saturate the magnetic recording medium, apply a second polarized light to the surface of the magnetic recording medium to which the second magnetic field is being applied, and measure a light polarization state of a second reflected light that is reflected;

a third measurement section configured to apply a third magnetic field having an opposite direction of the second magnetic field to the continuously moving magnetic recording medium, apply a third polarized light to the surface of the magnetic recording medium to which the third magnetic field is being applied, and measure a light polarization state of a third reflected light that is reflected; and a control section configured to control the third measurement section to adjust a strength of the third magnetic field so that a measurement value of the light polarization state of the third reflected light is a mean value of a measurement value of the light polarization state of the first reflected light and a measurement value of the light polarization state of the second reflected light, and obtain the strength of the third magnetic field when the measurement value of the light polarization state of the third reflected light becomes equal to the mean value.

A third disclosure is a method for manufacturing a magnetic recording medium, the method including:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying a third magnetic field having an opposite direction of the second magnetic field to the continuously moving magnetic recording medium, applying a third polarized light to the surface of the magnetic recording medium to which the third magnetic field is being applied, and measuring a light polarization state of a third reflected light that is reflected;

adjusting a strength of the third magnetic field so that a measurement value of the light polarization state of the third reflected light is a mean value of a measurement value of the light polarization state of the first reflected light and a measurement value of the light polarization state of the second reflected light, and obtaining, as a coercive force, the strength of the third magnetic field when the measurement value of the light polarization state of the third reflected light becomes equal to the mean value; and adjusting a film formation condition for the continuously moving magnetic recording medium on the basis of the coercive force obtained.

A fourth disclosure is a method for measuring magnetic characteristics, the method including:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying light to the surface of the continuously moving magnetic recording medium, and measuring a light polarization state of a third reflected light that is reflected; and calculating a ratio $(\Delta A_{20}/\Delta A_{10})$ of a difference $\Delta A_{20}$ $(=A_2-A_0)$ between a mean value $A_0$ of measurement values of the light polarization states of the first reflected light and the second reflected light and a measurement value $A_2$ of the light polarization state of the third reflected light to a difference $\Delta A_{10}$ $(=A_1-A_0)$ between the mean value $A_0$ and the measurement value $A_1$ of the light polarization state of the first reflected light.

A fifth disclosure is an apparatus for measuring magnetic characteristics, the apparatus including:

a first measurement section configured to apply a first magnetic field to a continuously moving magnetic recording medium to magnetically saturate the magnetic recording medium, apply a first polarized light to a surface of the magnetic recording medium to which the first magnetic field is being applied, and measure a light polarization state of a first reflected light that is reflected;

a second measurement section configured to apply a second magnetic field having an opposite direction of the first magnetic field to the continuously moving magnetic recording medium to magnetically saturate the magnetic recording medium, apply a second polarized light to the surface of the magnetic recording medium to which the second magnetic field is being applied, and measure a light polarization state of a second reflected light that is reflected;

a third measurement section configured to apply light to the surface of the continuously moving magnetic recording medium, and measure a light polarization state of a third reflected light that is reflected; and an arithmetic section configured to calculate a ratio $(\Delta A_{20}/\Delta A_{10})$ of a difference $\Delta A_{20}$ $(=A_2-A_0)$ between a mean value $A_0$ of measurement values of the light polarization states of the first reflected light and the second reflected light and a measurement value $A_2$ of the light polarization state of the third reflected light to a difference $\Delta A_{10}$ $(=A_1-A_0)$ between the mean value $A_0$ and the measurement value $A_1$ of the light polarization state of the first reflected light.

A sixth disclosure is a method for manufacturing a magnetic recording medium, the method including:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying light to the surface of the continuously moving magnetic recording medium, and measuring a light polarization state of a third reflected light that is reflected;

obtaining a squareness ratio by calculating a ratio $(\Delta A_{20}/\Delta A_{10})$ of a difference $\Delta A_{20}$ $(=A_2-A_0)$ between a mean value $A_0$ of measurement values of the light polarization states of the first reflected light and the second reflected light and a measurement value $A_2$ of the light polarization state of the third reflected light to a difference $\Delta A_{10}$ $(=A_1-A_0)$ between the mean value $A_0$ and the measurement value $A_1$ of the light polarization state of the first reflected light; and adjusting a film formation condition for the continuously moving magnetic recording medium on the basis of the squareness ratio obtained.

In the present disclosure, the light polarization states of the first reflected light, the second reflected light, and the third reflected light are, for example, the polarization axis angles (the Kerr rotation angles), ellipticities, reflection strengths, or the like of the first reflected light, the second reflected light, and the third reflected light, respectively.

Effects of the Invention

According to the present disclosure, magnetic characteristics of a continuously moving magnetic recording medium can be measured. Note that the effect written herein is not necessarily a limitative one; and any of the effects written in the present disclosure or an effect of a different nature from them is possible.

MODE FOR CARRYING OUT THE INVENTION

Embodiments of the present disclosure will now be described in the following order.

1 First embodiment (apparatus for measuring magnetic characteristics)
2 Second embodiment (apparatus for measuring magnetic characteristics)

1 First Embodiment

[Configuration of Magnetic Tape]

Figure 1:
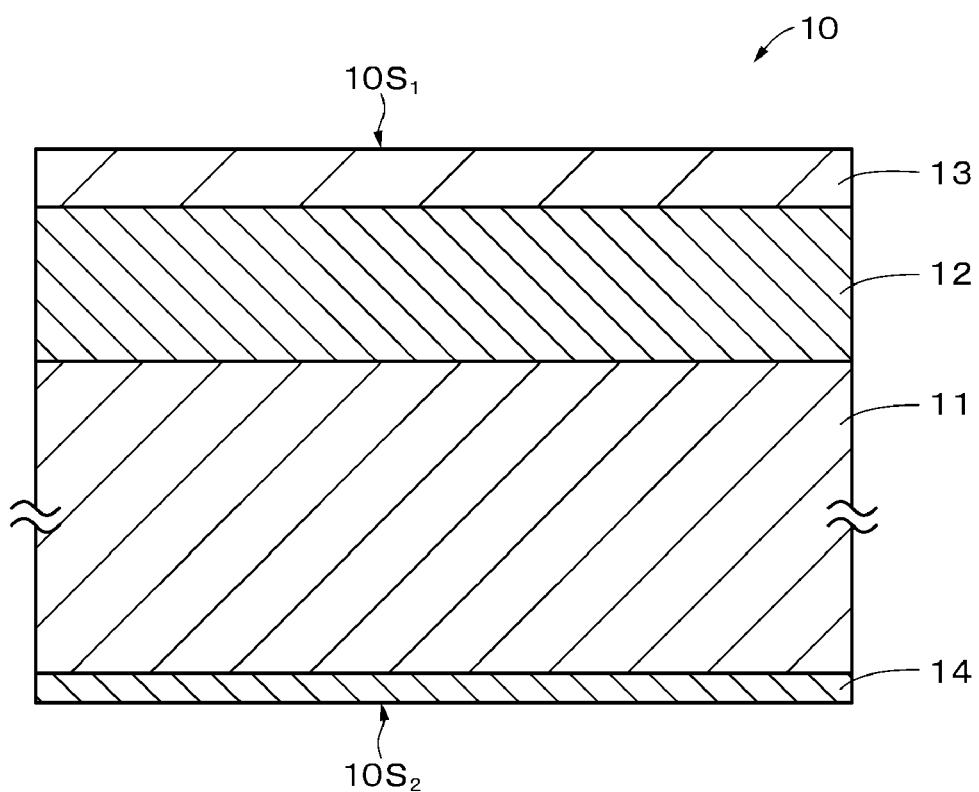
FIG. 1 is a cross-sectional view showing a configuration of a magnetic tape.

A configuration of a magnetic tape 10 of which magnetic characteristics are measured by an apparatus for measuring magnetic characteristics according to a first embodiment will now be described with reference to FIG. 1. The magnetic tape 10 is a coating-type magnetic tape of a perpendicular magnetic recording system, and includes a long-length substrate 11, a ground layer (nonmagnetic layer) 12 provided on one surface of the substrate 11, a magnetic layer (recording layer) 13 provided on the ground layer 12, and a back layer 14 provided on the other surface of the substrate 11. Note that the ground layer 12 and the back layer 14 are provided as necessary, and may not be provided. In the following, out of both surfaces of the magnetic tape 10, the surface on the side on which the magnetic layer 13 is provided is referred to as a magnetic surface $10S_1$, and the surface on the opposite side to it, that is, the side on which the back layer 14 is provided is referred to as a back surface $10S_2$.

The magnetic layer 13 contains, for example, a magnetic powder, a binder, and electrically conductive particles. The magnetic layer 13 may further contain, as necessary, additives such as a lubricant, a polisher, and an antirust. The magnetic powder is oriented in the thickness direction of the magnetic tape 10 (the perpendicular direction). As the magnetic powder, for example, ε-iron oxide magnetic powder, Co-containing spinel ferrite magnetic powder, hexagonal ferrite magnetic powder (for example, barium ferrite magnetic powder), or the like is used.

[Film Formation Apparatus for Magnetic Tapes]

Figure 2:
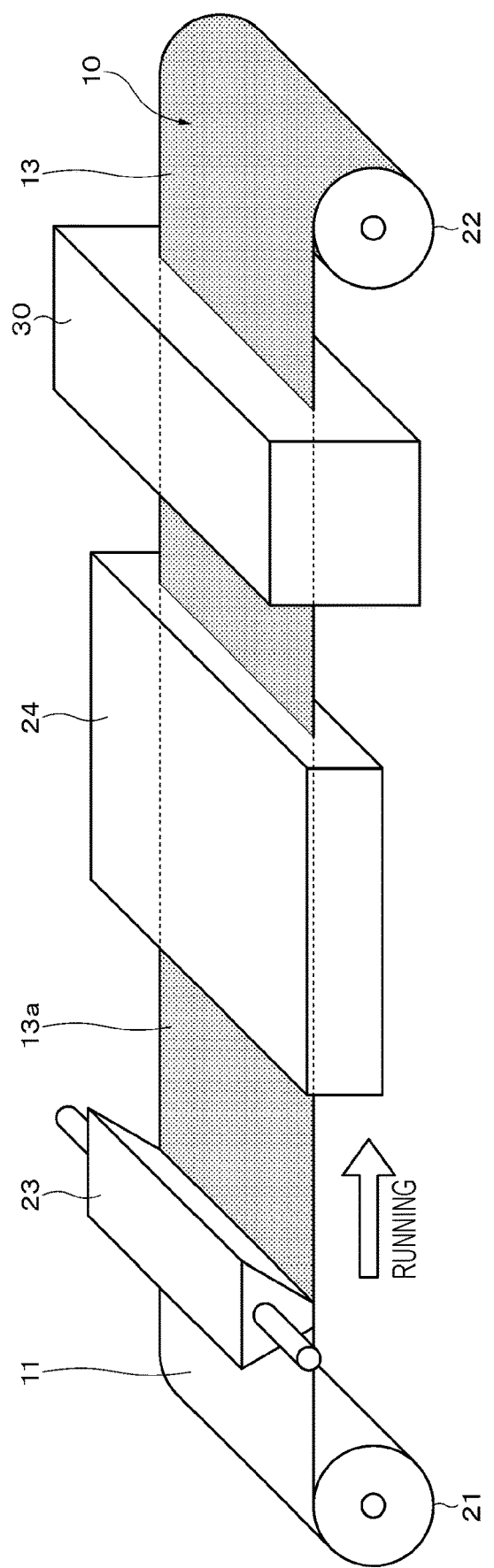
FIG. 2 is a schematic diagram showing a configuration of a film formation apparatus for magnetic tapes.

A film formation apparatus 20 used for the film formation of the magnetic tape 10 described above will now be described with reference to FIG. 2. Herein, a case where only the magnetic layer 13 is formed as a film on one surface of the substrate 11 is described for easier description. The film formation apparatus 20 is a film formation apparatus of a roll-to-roll form, and includes rolls 21 and 22, a film formation head 23, a drying furnace 24, and an apparatus for measuring magnetic characteristics 30.

In the film formation apparatus 20, a film-like substrate 11 wound in a roll form is wound out from one roll 21, and is wound in a roll form again by the other roll 22. The film formation head 23, the drying furnace 24, and the apparatus for measuring magnetic characteristics 30 are arranged in this order from the upstream side toward the downstream side on the running path of the substrate 11 that continuously moves (continuously runs) from one roll 21 toward the other roll 22. A magnetic field orientation apparatus for orienting the magnetic field of a magnetic powder contained in a coating material 13a to the perpendicular direction (the thickness direction of the substrate 11) may be provided in the drying furnace 24.

In the film formation apparatus 20 having the configuration mentioned above, the coating material 13a is applied by the film formation head 23 to one surface of the continuously running substrate 11, and then the coating material (coating) 13a is dried by the drying furnace 24; thus, the magnetic layer 13 is formed. Then, magnetic characteristics of the magnetic layer 13 immediately after formation are measured by the apparatus for measuring magnetic characteristics 30.

To stabilize film formation quality and improve the yield while maintaining productivity, it is desired that, in the process during production, magnetic characteristics necessary as quality be continuously measured and precise, quick feedback to the film formation process be made. To measure magnetic characteristics in this process, (A) measuring magnetic characteristics without breaking the magnetic tape 10 and (B) measuring magnetic characteristics in a state where the magnetic tape 10 continuously moves are necessary.

In the first embodiment, in order to enable (A) measuring magnetic characteristics without breaking the magnetic tape 10, magnetic characteristics of the magnetic tape 10 are measured by utilizing the magnetic Kerr effect. The magnetic Kerr effect is a phenomenon in which, in a case where a magnetized surface is irradiated with polarized light, the light polarization state (the angle of the polarization axis or the ellipticity) of reflected light changes in accordance with the magnetization state of the reflection surface. An external magnetic field is applied to a measurement sample, and the light polarization state based on the magnetic Kerr effect is measured while the strength of the external magnetic field is continuously changed; thereby, data equivalent to magnetic hysteresis are obtained, and magnetic characteristics such as coercive force or magnetization can be measured in a substitutive manner without breaking the measurement sample.

In order to enable (B) measuring magnetic characteristics in a state where the magnetic tape 10 continuously moves, a configuration including three measurement units in each of which an electromagnet that applies an external magnetic field and a detection section that utilizes the magnetic Kerr effect, that is, uses the magnetic Kerr effect to measure the magnetization state of the magnetic tape 10 are combined is employed.

[Apparatus for Measuring Magnetic Characteristics]

Figure 3:
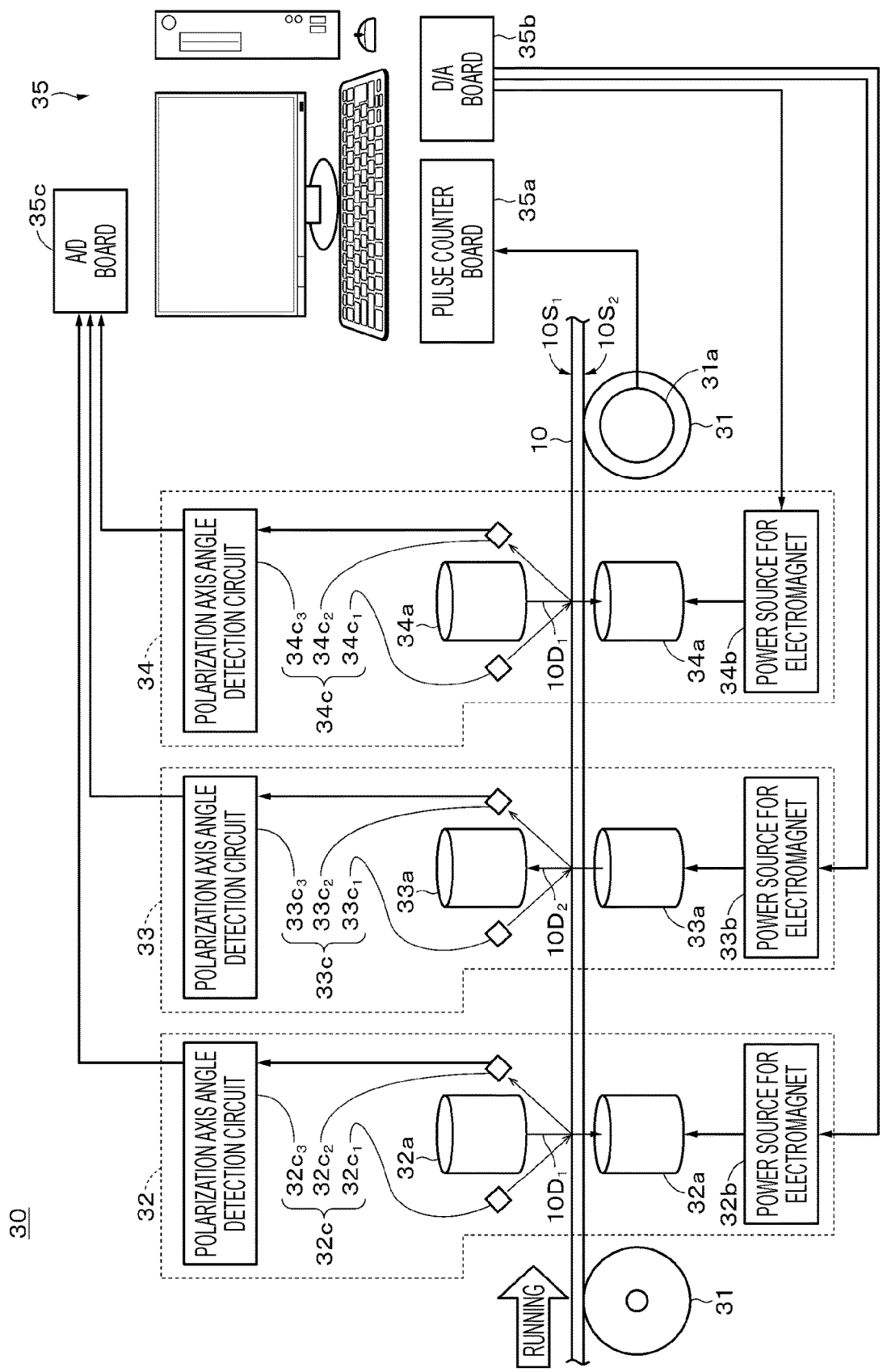
FIG. 3 is a schematic diagram showing a configuration of an apparatus for measuring magnetic characteristics according to a first embodiment of the present disclosure.

FIG. 3 shows a configuration of the apparatus for measuring magnetic characteristics 30 according to the first embodiment. The apparatus for measuring magnetic characteristics 30 includes a plurality of guide rolls 31, a negative-side saturation magnetization measurement section 32, a positive-side saturation magnetization measurement section 33, a magnetization measurement section 34, and a personal computer (hereinafter referred to as a "PC") 35. The negative-side saturation magnetization measurement section 32, the positive-side saturation magnetization measurement section 33, and the magnetization measurement section 34 are arranged in this order from the upstream side toward the downstream side on the conveyance path of the moving magnetic tape 10.

In the present specification, out of the thickness directions of the magnetic tape 10, the direction from the magnetic surface $10S_1$ toward the back surface $10S_2$ is referred to as a first perpendicular direction $10D_1$, and the opposite direction of it is referred to as a second perpendicular direction $10D_2$. Further, a state where an external magnetic field is applied to the magnetic tape 10 in the first perpendicular direction $10D_1$ and magnetic saturation is produced is referred to as a "negative-side magnetic saturation state", and the magnetization at this time is referred to as "negative-side saturation magnetization". On the other hand, a state where an external magnetic field is applied to the magnetic tape 10 in the second perpendicular direction $10D_2$ and magnetic saturation is produced is referred to as a "positive-side magnetic saturation state", and the magnetization at this time is referred to as "positive-side saturation magnetization".

Figure 4:
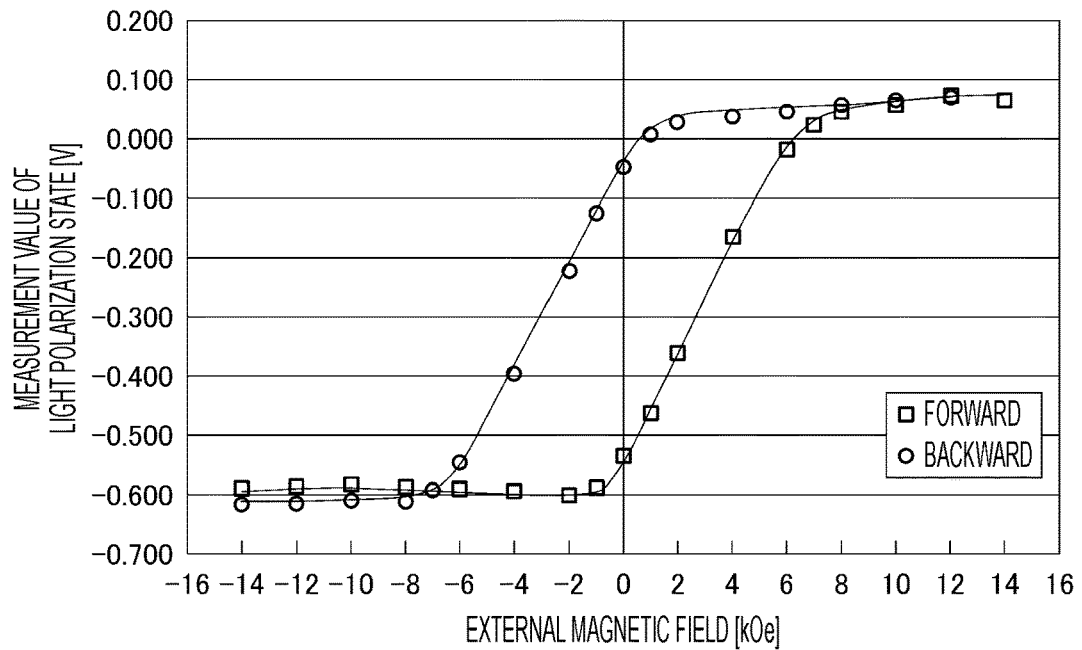
FIG. 4 is a graph showing an example of a measurement result of magnetic characteristics of a magnetic tape.

Each of the negative-side saturation magnetization measurement section 32, the positive-side saturation magnetization measurement section 33, and the magnetization measurement section 34 has a configuration that can obtain hysteresis like that shown in FIG. 4 (a relationship of the voltage value equivalent to the magnetization state of the magnetic tape 10 to the strength of the external magnetic field). However, in the first embodiment, as described below, a control to obtain such a hysteresis loop is not performed in the negative-side saturation magnetization measurement section 32, the positive-side saturation magnetization measurement section 33, or the magnetization measurement section 34. Note that FIG. 4 is an example of measurement in which the external magnetic field is changed while the magnetic tape 10 is kept at a standstill.

(Guide Rolls)

The plurality of guide rolls 31 is an example of a conveyance section, and is provided on the conveyance path of the magnetic tape 10. The plurality of guide rolls 31 continuously moves (continuously runs) the magnetic tape 10 in a direction (for example, the horizontal direction) going straight relative to the direction of the external magnetic field applied by each of the negative-side saturation magnetization measurement section 32, the positive-side saturation magnetization measurement section 33, and the magnetization measurement section 34. One of the plurality of guide rolls 31 is connected to an encoder 31a, and the encoder 31a supplies a pulse signal to the PC 35 in accordance with the rotation of the guide roll 31.

(Negative-Side Saturation Magnetization Measurement Section)

The negative-side saturation magnetization measurement section 32 applies an external magnetic field to the continuously moving magnetic tape 10 in the first perpendicular direction $10D_1$ to magnetically saturate the magnetic tape 10 on the negative side, applies polarized light to the magnetic surface $10S_1$ of the magnetic tape 10 to which the external magnetic field is being applied, and measures the polarization axis angle $\theta_1$ of reflected light affected by the negative-side magnetic saturation state (hereinafter referred to as "the polarization axis angle $\theta_1$ of the negative-side magnetic saturation state"). Note that the polarization axis angle $\theta_1$ of the negative-side magnetic saturation state is an example of a measurement value of the light polarization state of reflected light affected by the negative-side magnetic saturation state.

The negative-side saturation magnetization measurement section 32 includes an electromagnet 32a, a power source 32b, and a light polarization detection section 32c. The electromagnet 32a is an example of a magnetic field generation section, and applies an external magnetic field to the magnetic tape 10 in the first perpendicular direction $10D_1$. Specifically, the electromagnet 32a is capable of applying, in the first perpendicular direction $10D_1$, an external magnetic field having enough strength to magnetically saturate the magnetic tape 10 on the negative polarity side. The power source 32b is a power source for an electromagnet for driving the electromagnet 32a.

The light polarization detection section 32c includes an irradiation section $32c_1$, a light receiving section $32c_2$, and a polarization axis angle detection circuit $32c_3$. The irradiation section $32c_1$ applies polarized light to the magnetic surface $10S_1$ of the magnetic tape 10 located in the external magnetic field applied by the electromagnet 32a. The light receiving section $32c_2$ converts reflected light reflected at the magnetic surface $10S_1$ to an electrical signal by using a polarizing beam splitter, a photodetector, etc., and supplies the signal to the polarization axis angle detection circuit $32c_3$. The polarization axis angle detection circuit $32c_3$ detects the polarization axis angle $\theta_1$ of the reflected light on the basis of the signal supplied from the light receiving section $32c_2$, and supplies the polarization axis angle $\theta_1$ to the PC 35. The polarization axis angle detection circuit $32c_3$ is an example of a light polarization state detection circuit that detects the light polarization state of reflected light on the basis of a signal supplied from the light receiving section $32c_2$.

(Positive-Side Saturation Magnetization Measurement Section)

The positive-side saturation magnetization measurement section 33 applies an external magnetic field to the continuously moving magnetic tape 10 in the second perpendicular direction $10D_2$ to magnetically saturate the magnetic tape 10 on the positive side, applies polarized light to the magnetic surface $10S_1$ of the magnetic tape 10 to which the external magnetic field is being applied, and measures the polarization axis angle $\theta_2$ of reflected light affected by the positive-side magnetic saturation state (hereinafter referred to as "the polarization axis angle $\theta_2$ of the positive-side magnetic saturation state"). Note that the polarization axis angle $\theta_2$ of the positive-side magnetic saturation state is an example of a measurement value of the light polarization state of reflected light affected by the positive-side magnetic saturation state.

The positive-side saturation magnetization measurement section 33 includes an electromagnet 33$a$, a power source 33$b$, and a light polarization detection section 33$c$. The electromagnet 33$a$ is an example of a magnetic field generation section, and applies an external magnetic field to the magnetic tape 10 in the second perpendicular direction $10D_2$. Specifically, the electromagnet 33$a$ is capable of applying, in the second perpendicular direction $10D_2$, an external magnetic field having enough strength to magnetically saturate the magnetic tape 10 on the positive polarity side. The power source 33$b$ is a power source for an electromagnet for driving the electromagnet 33$a$.

The light polarization detection section 33$c$ includes an irradiation section $33c_1$, a light receiving section $33c_2$, and a polarization axis angle detection circuit $33c_3$. The irradiation section $33c_1$ applies polarized light to the magnetic surface $10S_1$ of the magnetic tape 10 located in the external magnetic field applied by the electromagnet 33$a$. The light receiving section $33c_2$ converts reflected light reflected at the magnetic surface $10S_1$ to an electrical signal by using a polarizing beam splitter, a photodetector, etc., and supplies the signal to the polarization axis angle detection circuit $33c_3$. The polarization axis angle detection circuit $33c_3$ detects the polarization axis angle $\theta_2$ of the reflected light on the basis of the signal supplied from the light receiving section $33c_2$, and supplies the polarization axis angle $\theta_2$ to the PC 35. The polarization axis angle detection circuit $33c_3$ is an example of a light polarization state detection circuit that detects the light polarization state of reflected light on the basis of a signal supplied from the light receiving section $33c_2$.

(Magnetization Measurement Section)

The magnetization measurement section 34 applies an external magnetic field to the continuously moving magnetic tape 10 in the first perpendicular direction $10D_1$ to demagnetize the magnetic tape 10, applies polarized light to the magnetic surface $10S_1$ of the magnetic tape 10 to which the external magnetic field is being applied, and measures the polarization axis angle $\theta_3$ of reflected light (hereinafter referred to as "the polarization axis angle $\theta_3$ of a demagnetization state"). Note that the polarization axis angle $\theta_3$ of the demagnetization state is an example of a measurement value of the light polarization state of reflected light reflected at the magnetic surface $10S_1$ in the demagnetization state.

The magnetization measurement section 34 includes an electromagnet 34$a$, a power source 34$b$, and a light polarization detection section 34$c$. The electromagnet 34$a$ is an example of a magnetic field generation section, and applies an external magnetic field to the magnetic tape 10 in the first perpendicular direction $10D_1$ to demagnetize the magnetic tape 10 magnetized by the positive-side saturation magnetization measurement section 33. The power source 34$b$ is a power source for an electromagnet for driving the electromagnet 34$a$.

The light polarization detection section 34$c$ includes an irradiation section $34c_1$, a light receiving section $34c_2$, and a polarization axis angle detection circuit $34c_3$. The irradiation section $34c_1$ applies polarized light to the magnetic surface $10S_1$ of the magnetic tape 10 located in the external magnetic field applied by the electromagnet 34$a$. The light receiving section $34c_2$ converts reflected light reflected at the magnetic surface $10S_1$ to an electrical signal by using a polarizing beam splitter, a photodetector, etc., and supplies the signal to the polarization axis angle detection circuit $34c_3$. The polarization axis angle detection circuit $34c_3$ detects the polarization axis angle $\theta_3$ of the reflected light on the basis of the signal supplied from the light receiving section $34c_2$, and supplies the polarization axis angle $\theta_3$ to the PC 35. The polarization axis angle detection circuit $34c_3$ is an example of a light polarization state detection circuit that detects the light polarization state of reflected light on the basis of a signal supplied from the light receiving section $34c_2$.

(PC)

The PC 35 is an example of a control section, and controls the whole of the apparatus for measuring magnetic characteristics 30. Specifically, the PC 35 controls the plurality of guide rolls 31, the negative-side saturation magnetization measurement section 32, the positive-side saturation magnetization measurement section 33, and the magnetization measurement section 34. Further, the PC 35 controls, in addition to the apparatus for measuring magnetic characteristics 30, the whole of the film formation apparatus 20 for the magnetic tape 10. Although herein a case where the PC 35 controls both the apparatus for measuring magnetic characteristics 30 and the film formation apparatus 20 for the magnetic tape 10 is described, the apparatus for measuring magnetic characteristics 30 and the film formation apparatus 20 for the magnetic tape 10 may be controlled by different control apparatuses.

The PC 35 includes a pulse counter board 35$a$; the pulse counter board 35$a$ counts pulse signals supplied from the encoder 31$a$, and calculates the movement distance of the continuously moving magnetic tape 10. The PC 35 includes a D/A board 35$b$, and controls the power sources 32$b$, 33$b$, and 34$b$ via the D/A board 35$b$ to adjust the output magnetic field strengths of the electromagnets 32$a$, 33$a$, and 34$a$. The PC 35 includes an A/D board 35$c$, and takes in the polarization axis angle $\theta_1$ of the negative-side magnetic saturation state, the polarization axis angle $\theta_2$ of the positive-side magnetic saturation state, and the polarization axis angle $\theta_3$ of the demagnetization state that are supplied from the polarization axis angle detection circuits $32c_3$, $33c_3$, and $34c_3$, respectively, via the A/D board 35$c$. At the time of the data taking-in, the PC 35 associates data and the measurement position on the magnetic tape 10 together on the basis of the count value of the pulse counter board 35$a$.

The PC 35 calculates the mean value $\theta_0$ $(=(\theta_1+\theta_2)/2)$ of the polarization axis angle $\theta_1$ of the negative-side magnetic saturation state supplied from the negative-side saturation magnetization measurement section 32 and the polarization axis angle $\theta_2$ of the positive-side magnetic saturation state supplied from the positive-side saturation magnetization measurement section 33. Then, the output magnetic field strength of the electromagnet 34$a$ is adjusted via the D/A board 35 and the power source 34$b$ so that the polarization axis angle $\theta_3$ of the demagnetization state supplied from the magnetization measurement section 34 is equal to the mean value $\theta_0$. In the following, this control is referred to as "demagnetization control", as appropriate. Specifically, the value of current to be supplied to the electromagnet 34a is controlled via the D/A board 35 and the power source 34b, and thereby the output magnetic field strength of the electromagnet 34a is adjusted. Since the magnetic tape 10 continuously moves without stopping, the PC 35 continues the demagnetization control mentioned above while constantly managing the position of the magnetic tape 10.

The PC 35 adjusts the strength of the magnetic field in the magnetization measurement section 34 by using data acquired in the same position of the continuously moving magnetic tape 10 (that is, the polarization axis angle $\theta_1$ of the negative-side magnetic saturation state, the polarization axis angle $\theta_2$ of the positive-side magnetic saturation state, and the polarization axis angle $\theta_3$ of the demagnetization state). That is, the PC 35 performs demagnetization control in the magnetization measurement section 34 on the basis of data that is acquired when the magnetic tape 10 existing in the magnetization measurement section 34 is located in the negative-side saturation magnetization measurement section 32 and the positive-side saturation magnetization measurement section 33 (that is, the polarization axis angle $\theta_1$ of the negative-side magnetic saturation state and the polarization axis angle $\theta_2$ of the positive-side magnetic saturation state). By performing an arithmetic operation by using data of the same position on the magnetic tape 10, a light polarization variation resulting from a difference in position on the magnetic tape 10 (in a case where film thickness or film quality varies, also this variation is included) can be canceled. Thereby, a result that can substitute for part of conventional measurement in a standstill state is obtained even for a continuously moving magnetic tape 10.

There is a case where, immediately after demagnetization control is started, agreement with the mean value $\theta_0$ mentioned above is not made fully (that is, demagnetization is not made fully); however, feedback whereby the demagnetization state can be maintained is achieved by continuously performing demagnetization control. The PC 35 acquires, as the coercive force, the strength of the magnetic field applied by the electromagnet 34a in a state where the demagnetization state is maintained successfully. Specifically, the PC 35 assesses whether the polarization axis angle $\theta_3$ of the demagnetization state is equal to the mean value $\theta_0$ or not; the PC 35 converts the value of current that is supplied to the electromagnet 34a when the polarization axis angle $\theta_3$ of the demagnetization state becomes the mean value $\theta_0$ to magnetic field strength, and acquires the coercive force. The PC 35 may display the measurement result of coercive force on a display apparatus of the PC 35, or may output the measurement result to an external device, as necessary.

[Operation of Apparatus for Measuring Magnetic Characteristics]

Figure 5:
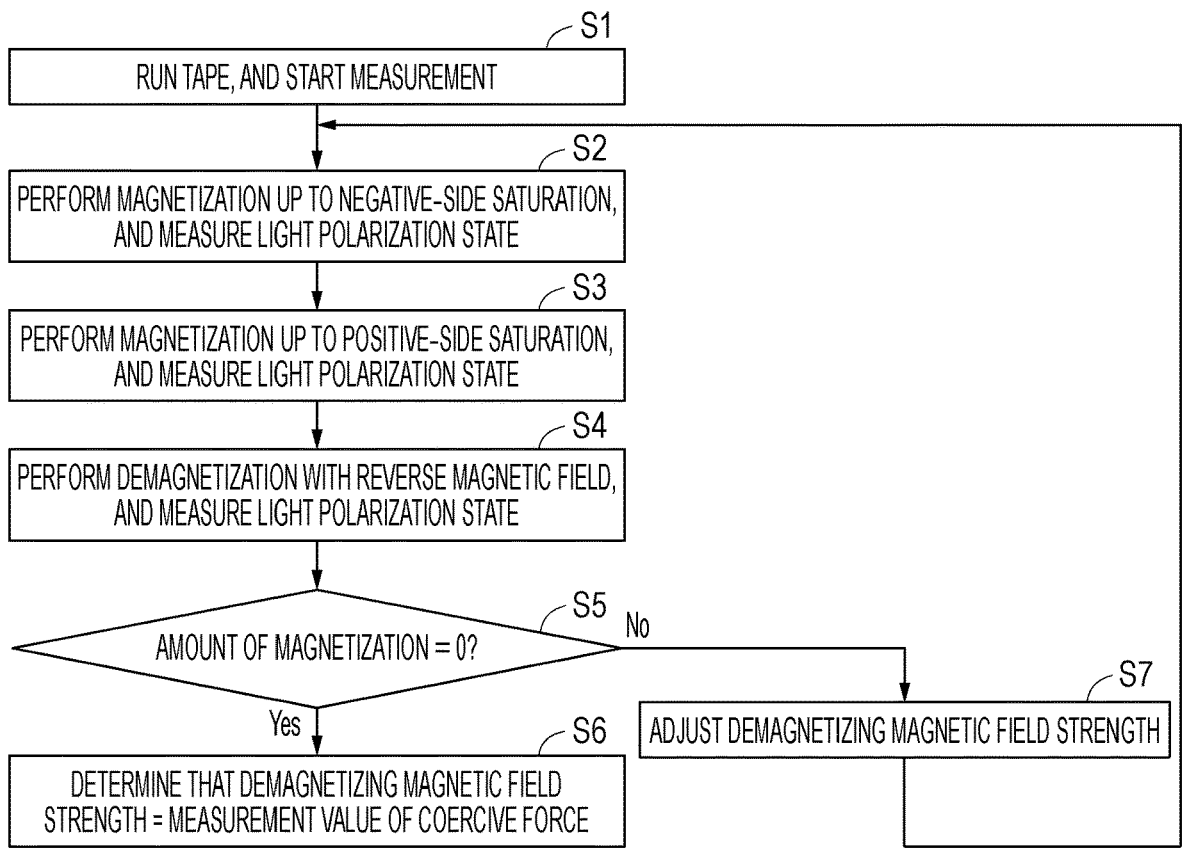
FIG. 5 is a flow chart for describing an operation of an apparatus for measuring magnetic characteristics according to the first embodiment of the present disclosure.

Hereinbelow, an operation of the apparatus for measuring magnetic characteristics 30 having the configuration described above is described with reference to FIG. 5.

First, a worker uses the PC 35 to execute a manipulation of the start of film formation of the magnetic tape 10; then, in step S1, the PC 35 drives the plurality of guide rolls 31 to continuously move the magnetic tape 10 in a direction (for example, the horizontal direction) going straight relative to the direction of the external magnetic field applied by each of the negative-side saturation magnetization measurement section 32, the positive-side saturation magnetization measurement section 33, and the magnetization measurement section 34.

Next, in step S2, the PC 35 controls the negative-side saturation magnetization measurement section 32 to apply a sufficiently large external magnetic field (for example, −15 kOe or the like) to the continuously moving magnetic tape 10 in the first perpendicular direction $10D_1$, and magnetically saturates the magnetic tape 10 on the negative side. Further, polarized light is applied to the magnetic surface $10S_1$ of the magnetic tape 10 existing in the external magnetic field, and the polarization axis angle $\theta_1$ of reflected light of the polarized light (that is, the polarization axis angle $\theta_1$ of the negative-side magnetic saturation state) is measured and is supplied to the PC 35.

Next, in step S3, the PC 35 controls the positive-side saturation magnetization measurement section 33 to apply a sufficiently large external magnetic field (for example, +15 kOe or the like) to the continuously moving magnetic tape 10 in the second perpendicular direction $10D_2$, and magnetically saturates the magnetic tape 10 on the positive side. Further, polarized light is applied to the magnetic surface $10S_1$ of the magnetic tape 10 existing in the external magnetic field, and the polarization axis angle $\theta_2$ of reflected light of the polarized light (that is, the polarization axis angle $\theta_2$ of the positive-side magnetic saturation state) is measured and is supplied to the PC 35.

Next, in step S4, the PC 35 controls the magnetization measurement section 34 to apply an external magnetic field to the continuously moving magnetic tape 10 in the first perpendicular direction $10D_1$, and demagnetizes the magnetic tape 10. Specifically, the value of current to be supplied to the electromagnet 34a is controlled via the D/A board 35 and the power source 34b, and thereby the magnetic tape 10 is demagnetized. Further, polarized light is applied to the magnetic surface $10S_1$ of the magnetic tape 10 existing in the external magnetic field applied by the magnetization measurement section 34, and the polarization axis angle $\theta_3$ of reflected light of the polarized light (that is, the polarization axis angle $\theta_3$ of the demagnetization state) is measured and is supplied to the PC 35.

Next, in step S5, the PC 35 calculates the mean value $\theta_0$ ($=(\theta_1+\theta_2)/2$) of the polarization axis angle $\theta_1$ measured in step S2 and the polarization axis angle $\theta_2$ measured in step S3. Then, it is assessed whether the polarization axis angle $\theta_3$ measured in step S4 is equal to the calculated mean value $\theta_0$ or not. Whether the magnetization of the magnetic tape 10 is zero or not can be assessed by thus assessing whether the polarization axis angle $\theta_3$ is equal to the mean value $\theta_0$ or not.

In a case where it is assessed that the polarization axis angle $\theta_3$ measured in step S4 is equal to the mean value $\theta_0$, in step S6, the PC 35 converts the value of current that is supplied to the electromagnet 34a when it is assessed that the values are equal as mentioned above to magnetic field strength, and acquires the coercive force.

On the other hand, in a case where in step S6 it is assessed that the polarization axis angle $\theta_3$ measured in step S5 is not equal to the mean value $\theta_0$, in step S7, the PC 35 adjusts the magnetic field strength of the magnetization measurement section 34 so that the polarization axis angle $\theta_3$ measured in step S4 is equal to the mean value $\theta_0$. Specifically, the value of current to be supplied to the electromagnet 34a is controlled via the D/A board 35 and the power source 34b so that the polarization axis angle $\theta_3$ measured in step S4 is equal to the mean value $\theta_0$, and thereby the output magnetic field strength of the electromagnet 34a is adjusted.

Note that, since the magnetic tape 10 continuously moves, the processing of steps S1 to S7 is set to be continuously performed without a break. Further, the encoder 31a, etc. are used to manage the position of the magnetic tape 10 so that the movement distance of the magnetic tape 10 can be grasped; thus, the measurement, comparison, adjustment, etc. of steps S2 to S7 are allowed to be performed in the same position on the magnetic tape 10.

Table 1 shows a result of measurement in which the coercive force of a magnetic tape 10 with the coercive force set to 2.5 [kOe] was measured repeatedly 10 times by using the apparatus for measuring magnetic characteristics 30 according to the first embodiment. From Table 1, it can be seen that, in the apparatus for measuring magnetic characteristics 30 according to the first embodiment, the coercive force of the continuously moving magnetic tape 10 can be measured with good precision in a non-destructive, non-contact manner.

TABLE 1

| Number of times of measurement | Measurement value of coercive force (kOe) |
| --- | --- |
| 1 | 2.57 |
| 2 | 2.62 |
| 3 | 2.67 |
| 4 | 2.57 |
| 5 | 2.41 |
| 6 | 2.41 |
| 7 | 2.41 |
| 8 | 2.36 |
| 9 | 2.41 |
| 10 | 2.36 |
| Average | 2.48 |
| 3 sigma | 0.35 |

[Effects]

In the apparatus for measuring magnetic characteristics 30 according to the first embodiment, the coercive force (magnetic characteristics) of the magnetic tape 10 can be measured without bringing the continuously moving magnetic tape 10 to a standstill or breaking the magnetic tape 10.

In a roll-to-roll film formation process, magnetic characteristics of the magnetic tape 10 can be measured quickly without interrupting running-based film formation or breaking the magnetic tape 10; therefore, a measurement result of magnetic characteristics can be fed back to the film formation process rapidly and appropriately. Thus, the yield can be improved. Further, the occurrence of defects can be further suppressed by controlling film formation conditions on the basis of feedback of a measurement result of magnetic characteristics so that the characteristics fall within a range narrower than the standard value range of the process.

2 Second Embodiment

[Apparatus for Measuring Magnetic Characteristics]

Figure 6:
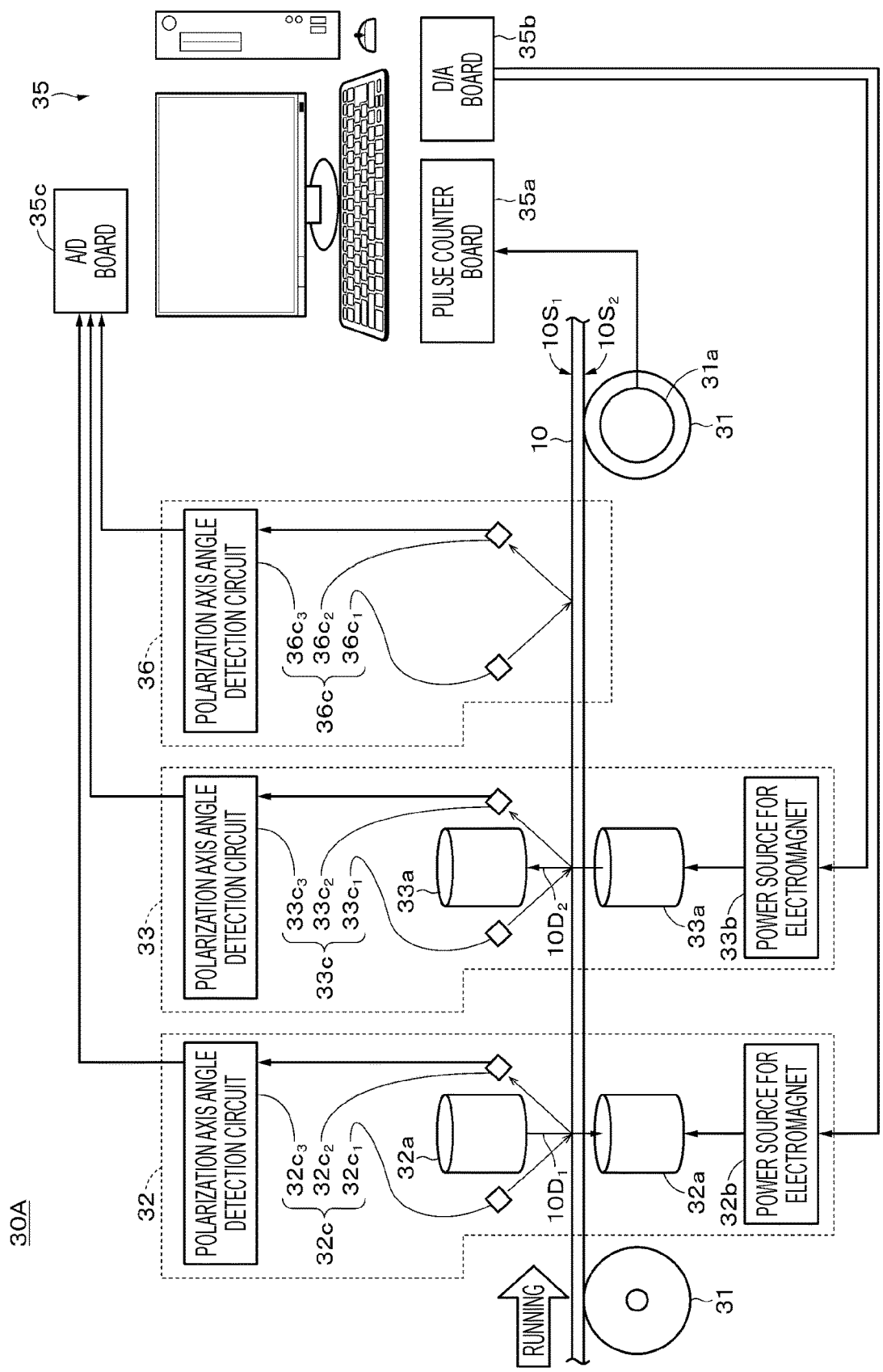
FIG. 6 is a schematic diagram showing a configuration of an apparatus for measuring magnetic characteristics according to a second embodiment of the present disclosure.

FIG. 6 shows a configuration of an apparatus for measuring magnetic characteristics 30A according to a second embodiment. The apparatus for measuring magnetic characteristics 30A differs from the apparatus for measuring magnetic characteristics 30 according to the first embodiment in that the apparatus for measuring magnetic characteristics 30A includes a residual magnetization measurement section 36 in place of the magnetization measurement section 34.

(Residual Magnetization Measurement Section)

The residual magnetization measurement section 36 applies polarized light to the magnetic surface $10S_1$ of the magnetic tape 10 to which an external magnetic field is not applied, and measures the polarization axis angle $\theta_4$ of reflected light (hereinafter referred to as "the polarization axis angle $\theta_4$ of a residual magnetization state"). Note that the polarization axis angle $\theta_4$ of the residual magnetization state is an example of a measurement value of the light polarization state of reflected light affected by residual magnetization.

The residual magnetization measurement section 36 includes a light polarization detection section $36c$. The light polarization detection section $36c$ includes an irradiation section $36c_1$, a light receiving section $36c_2$, and a polarization axis angle detection circuit $36c_3$. The irradiation section $36c_1$ applies polarized light to the magnetic surface $10S_1$ of the magnetic tape 10 whose the external magnetic field is not applied by the electromagnet. The light receiving section $36c_2$ converts reflected light reflected at the magnetic surface $10S_1$ to an electrical signal by using a polarizing beam splitter or a photodetector, and supplies the signal to the polarization axis angle detection circuit $36c_3$. The polarization axis angle detection circuit $36c_3$ detects the polarization axis angle $\theta_4$ of the reflected light on the basis of the signal supplied from the light receiving section $36c_2$, and supplies the polarization axis angle $\theta_4$ to the PC 35. The polarization axis angle detection circuit $36c_3$ is an example of a light polarization state detection circuit that detects the light polarization state of reflected light on the basis of a signal supplied from the light receiving section $36c_2$.

(PC)

The PC 35 is an example of an arithmetic section, and controls the whole of the apparatus for measuring magnetic characteristics 30A. Specifically, the PC 35 controls the plurality of guide rolls 31, the negative-side saturation magnetization measurement section 32, the positive-side saturation magnetization measurement section 33, and the residual magnetization measurement section 36. The PC 35 takes in the polarization axis angle $\theta_1$ of the negative-side magnetic saturation state, the polarization axis angle $\theta_2$ of the positive-side magnetic saturation state, and the polarization axis angle $\theta_4$ of the residual magnetization state that are supplied from the polarization axis angle detection circuits $32c_3$, $33c_3$, and $36c_3$, respectively, via the A/D board $35c$. At the time of the data taking-in, the PC 35 associates data and the measurement position on the magnetic tape 10 together on the basis of the count value of the pulse counter board $35a$.

The PC 35 calculates the mean value $\theta_0$ $(=(\theta_1+\theta_2)/2)$ of the polarization axis angle $\theta_1$ of the negative-side magnetic saturation state supplied from the negative-side saturation magnetization measurement section 32 and the polarization axis angle $\theta_2$ of the positive-side magnetic saturation state supplied from the positive-side saturation magnetization measurement section 33. Then, the difference $\Delta\theta_{10}$ $(=\theta_1-\theta_0)$ between the polarization axis angle $\theta_1$ of the negative-side magnetic saturation state and the mean value $\theta_0$ and the difference $\Delta\theta_{40}$ $(=\theta_4-\theta_0)$ between the polarization axis angle $\theta_4$ of the residual magnetization state and the mean value $\theta_0$ are calculated. When performing the calculation, since data and the measurement position on the magnetic tape 10 are associated together beforehand, it is preferable that an arithmetic operation be performed using data of the same position on the magnetic tape 10 and a light polarization variation resulting from a difference in position on the magnetic tape 10 (in a case where film thickness or film quality varies, also this variation is included) be canceled.

Difference $\Delta\theta_{10}$ means the polarization axis angle $\theta_1'$ $(=\theta_1-\theta_0)$ of the negative-side magnetic saturation state with the mean value $\theta_0$ as a reference. Difference $\Delta\theta_{40}$ means the polarization axis angle $\theta_4'$ $(=\theta_4-\theta_0)$ of the residual magnetization state with the mean value $\theta_0$ as a reference. Difference $\Delta\theta_{10}$ is an example of a measurement value of the light polarization state of the negative-side magnetic saturation state using, as a reference, the mean value of the measurement value of the light polarization state of the negative-side magnetic saturation state and the measurement value of the light polarization state of the positive-side magnetic saturation state. Difference $\Delta\theta_{40}$ is an example of a measurement value of the light polarization state of the residual magnetization state using, as a reference, the mean value of the measurement value of the light polarization state of the negative-side magnetic saturation state and the measurement value of the light polarization state of the positive-side magnetic saturation state.

The PC 35 uses the calculated differences $\Delta\theta_{10}$ and $\Delta\theta_{40}$ to calculate the ratio $(\Delta\theta_{40}/\Delta\theta_{10})$ of difference $\Delta\theta_{40}$ to difference $\Delta\theta_{10}$, and obtains the squareness ratio. Note that the PC 35 calculates the squareness ratio described above by using data (that is, the polarization axis angle $\theta_1$ of the negative-side magnetic saturation state, the polarization axis angle $\theta_2$ of the positive-side magnetic saturation state, and the polarization axis angle $\theta_4$ of the residual magnetization state) acquired in the same position of the continuously moving magnetic tape 10. As described above, the PC 35 takes in and stores measurement data and the measurement position on the magnetic tape 10 while associating them together, and can therefore calculate the squareness ratio by using measurement data in the same position of the magnetic tape 10.

[Method for Measuring Magnetic Characteristics]

Figure 7:
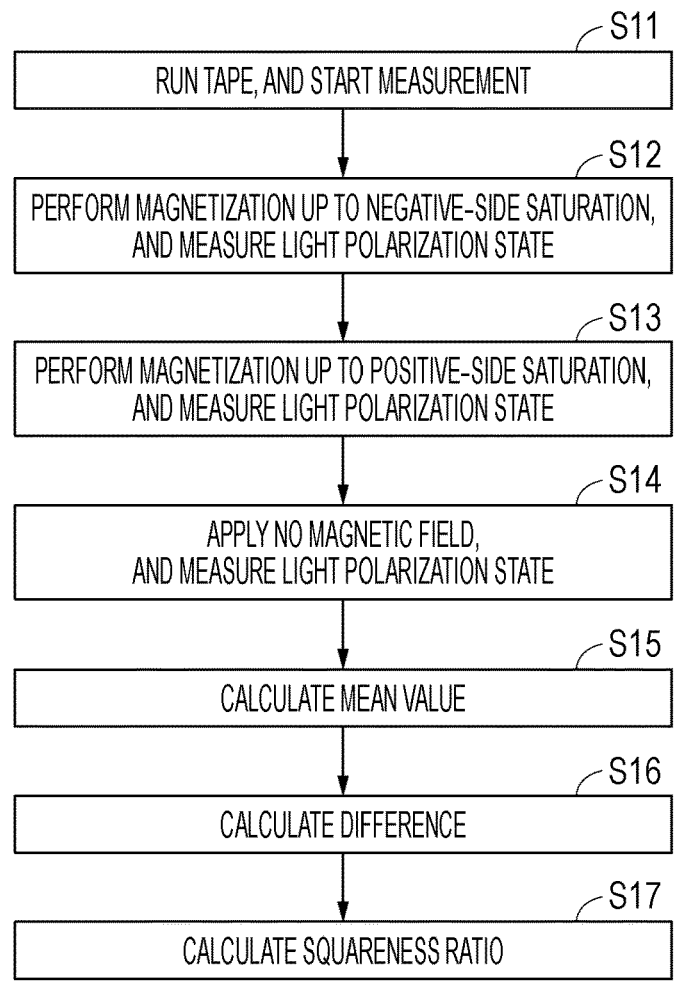
FIG. 7 is a flow chart for describing an operation of an apparatus for measuring magnetic characteristics according to the second embodiment of the present disclosure.

Hereinbelow, an operation of the apparatus for measuring magnetic characteristics 30A having the configuration described above is described with reference to FIG. 7.

First, a worker uses the PC 35 to execute a manipulation of the start of film formation of the magnetic tape 10; then, in step S11, the PC 35 continuously moves the magnetic tape 10 like in step S1 in the first embodiment.

Next, in step S12, the PC 35 measures the polarization axis angle $\theta_1$ (that is, the polarization axis angle $\theta_1$ of the negative-side magnetic saturation state) in a similar manner to step S2 in the first embodiment, and supplies the polarization axis angle $\theta_1$ to the PC 35 itself Next, in step S13, the PC 35 measures the polarization axis angle $\theta_2$ (that is, the polarization axis angle $\theta_2$ of the positive-side magnetic saturation state) in a similar manner to step S3 in the first embodiment, and supplies the polarization axis angle $\theta_2$ to the PC 35 itself Next, in step S14, the PC 35 applies polarized light to the magnetic surface $10S_1$ of the continuously running magnetic tape 10 to which an external magnetic field is not applied by an electromagnet, measures the polarization axis angle $\theta_4$ of reflected light of the polarized light (that is, the polarization axis angle $\theta_4$ of the residual magnetization state), and supplies the polarization axis angle $\theta_4$ to the PC 35 itself Next, in step S15, the PC 35 calculates the mean value $\theta_0$ $(=(\theta_1+\theta_2)/2)$ of the polarization axis angle $\theta_1$ measured in step S12 and the polarization axis angle $\theta_2$ measured in step S13.

Next, in step S16, the PC 35 calculates the difference $\Delta\theta_{10}=\theta_1-\theta_0$ between the polarization axis angle $\theta_1$ measured in step S12 and the mean value $\theta_0$ calculated in step S15. Further, the PC 35 calculates the difference $\Delta\theta_{40}=\theta_4-\theta_0$ between the polarization axis angle $\theta_4$ measured in step S14 and the mean value $\theta_0$ calculated in step S15.

Next, in step S17, the PC 35 uses the differences $\Delta\theta_{10}$ and $\Delta\theta_{40}$ calculated in step S16 to calculate the ratio $(\Delta\theta_{40}/\Delta\theta_{10})$ of difference $\Delta\theta_{40}$ to difference $\Delta\theta_{10}$, and obtains the squareness ratio.

Note that, since the magnetic tape 10 continuously moves, the processing of steps S11 to S17 is set to be continuously performed without a break. Further, the encoder 31a, etc. are used to manage the position of the magnetic tape 10 so that the movement distance of the magnetic tape 10 can be grasped; thus, the measurement of steps S12 to S14 are allowed to be performed in the same position on the magnetic tape 10.

[Effects]

In the apparatus for measuring magnetic characteristics 30A according to the second embodiment, the squareness ratio (magnetic characteristics) of the magnetic tape 10 can be measured without bringing the continuously moving magnetic tape 10 to a standstill or breaking the magnetic tape 10.

Modification Examples

Hereinabove, the first and second embodiments of the present disclosure are specifically described; however, the present disclosure is not limited to the first or second embodiment described above, but may make various modifications based on the technical idea of the present disclosure. For example, the configurations, methods, processes, shapes, materials, numerical values, etc. shown in the first and second embodiments described above are only examples, and configurations, methods, processes, shapes, materials, numerical values, etc. different from them may be used as necessary. Further, configurations, methods, processes, shapes, materials, numerical values, etc. of the first and second embodiments described above may be combined with each other without departing from the spirit of the present disclosure.

Although the first and second embodiments described above have described a case where magnetic characteristics of a continuously running (continuously moving) magnetic tape 10 are measured, the present disclosure is not limited to the measurement of magnetic characteristics of the magnetic tape 10, but can be applied also to the measurement of magnetic characteristics of a magnetic recording medium other than the magnetic tape 10. For example, the present disclosure can be applied also to the measurement of magnetic characteristics of a continuously rotating magnetic disk (for example, a hard disk). In this case, magnetic characteristics (for example, the coercive force, the squareness ratio, or the like) of the continuously rotating magnetic disk can be measured in a non-destructive, non-contact manner.

Figure 8:
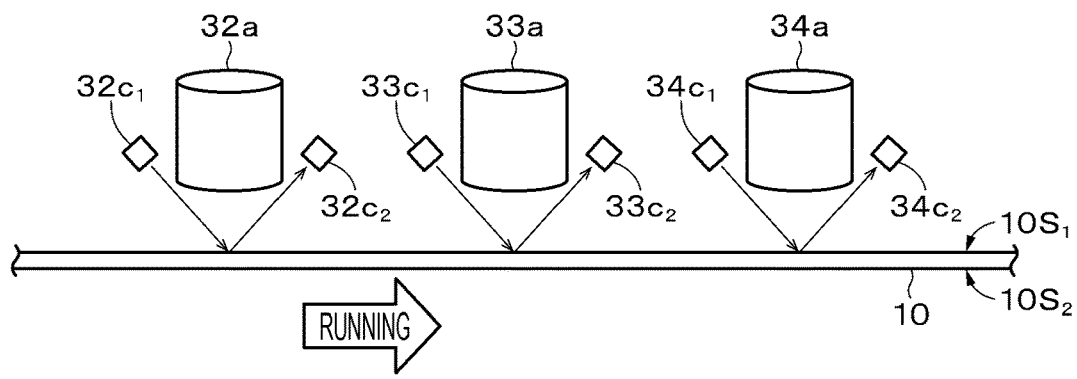
FIG. 8 is a schematic diagram showing a configuration of an apparatus for measuring magnetic characteristics according to a modification example.

Although the first and second embodiments described above have described apparatuses for measuring magnetic characteristics 30 and 30A in which a magnetic tape 10 is caused to pass through gap portions of electromagnets 32a, 33a, and 34a and the light polarization state of the magnetic surface $10S_1$ of the magnetic tape 10 passing through the gap portions is measured, the configuration of the apparatus for measuring magnetic characteristics is not limited to this. For example, as shown in FIG. 8, the electromagnets 32a, 33a, and 34a may be provided only on one surface side of the magnetic tape 10 (for example, the magnetic surface $10S_1$ side), and the light polarization state of the magnetic surface $10S_1$ of the magnetic tape 10 to which an external magnetic field is being applied by the electromagnet 32a, 33a, or 34a may be measured.

Although the first and second embodiments described above have described a case where the apparatuses for measuring magnetic characteristics 30 and 30A are controlled by a PC 35, the apparatuses for measuring magnetic characteristics 30 and 30A may be controlled by a dedicated control apparatus or the like in place of the PC 35.

Although the first embodiment described above has described a method in which the coercive force of the magnetic tape 10 is measured by the apparatus for measuring magnetic characteristics 30, it is also possible to employ a method in which the saturation magnetization of the magnetic tape 10 is measured by the apparatus for measuring magnetic characteristics 30 in the following manner. That is, a relationship between the amount of magnetization of the magnetic tape 10 and the amount of change of the polarization axis angle based on magnetization is found in advance, and a conversion factor is prepared and is stored in the storage section of the PC 35 in advance. The PC 35 compares the two polarization axis angles of the negative-side saturation magnetization measurement section 32 and the positive-side saturation magnetization measurement section 33 by using measurement values of the same position on the magnetic tape 10, and uses the conversion factor mentioned above to convert the difference between the two values to the amount of magnetization; thus, obtains the amount of saturation magnetization. Note that it is also possible to calculate the difference between the mean value of the measurement values of the negative-side and positive-side saturation magnetizations as a reference and the measurement value of the negative-side or positive-side saturation magnetization measurement section and use the difference for conversion.

Figure 9:
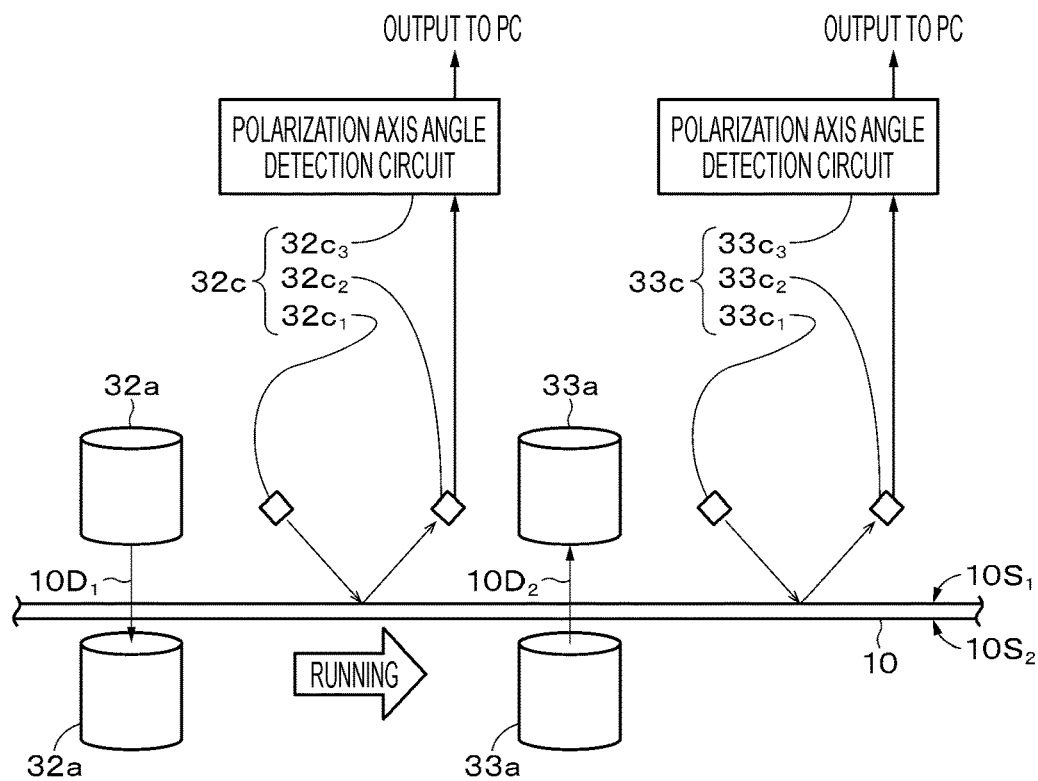
FIG. 9 is a schematic diagram showing a configuration of an apparatus for measuring magnetic characteristics according to a modification example.

Although the first embodiment described above has described a configuration of an apparatus for measuring magnetic characteristics 30 that measures the coercive force of the magnetic tape 10, also residual magnetization can be measured by employing the following configuration. That is, as shown in FIG. 9, the irradiation section $32c_1$ and the light receiving section $32c_2$ are provided in positions more on the downstream side of the conveyance path of the magnetic tape 10 than the electromagnet 32a and more on the upstream side of the conveyance path of the magnetic tape 10 than the electromagnet 33a. The irradiation section $33c_1$ and the light receiving section $33c_2$ are provided in positions more on the downstream side of the conveyance path of the magnetic tape 10 than the electromagnet 33a. A relationship between the amount of magnetization of the magnetic tape 10 and the amount of change of the polarization axis angle based on magnetization is found in advance, and a conversion factor is prepared and is stored in the storage section of the PC 35 in advance.

The apparatus for measuring magnetic characteristics 30 having the configuration described above operates in the following manner. First, the PC 35 uses the electromagnet 32a to magnetically saturate the magnetic tape 10 on the negative side, and then uses the light polarization detection section 32c to measure the polarization axis angle in a position outside the magnetic field area of the electromagnet 32a. Subsequently, further on the downstream side, the magnetic tape 10 is magnetically saturated on the positive side by the electromagnet 33a, and then the polarization axis angle is measured by the light polarization detection section 33c in a position outside the magnetic field area of the electromagnet 33a. After that, the PC 35 compares the two polarization axis angles obtained by the light polarization detection section 32c and the light polarization detection section 33c by using measurement values of the same position on the magnetic tape 10, and uses the conversion factor mentioned above to convert the difference between the two values to the amount of magnetization; thus, obtains the amount of residual magnetization. Note that it is also possible to calculate the difference between the mean value of the measurement values in the light polarization detection section 32c and the light polarization detection section 33c as a reference and the measurement value in the light polarization detection section 32c or the light polarization detection section 33c and use the difference for conversion.

It is also possible to measure the squareness ratio with the apparatus for measuring magnetic characteristics 30 according to the first embodiment. That is, it is also possible to measure the squareness ratio by a method in which the electromagnet 34a is not electrically energized but set in a nonuse state and an operation similar to the operation of the apparatus for measuring magnetic characteristics 30A according to the second embodiment is performed.

Although the first embodiment described above has described an example in which the value of current that is supplied to the electromagnet 34a when the polarization axis angle $\theta_3$ of the demagnetization state becomes equal to the mean value $\theta_0$ is converted to magnetic field strength to obtain the coercive force, the method for measuring the coercive force is not limited to this. For example, it is also possible to employ a method in which the magnetization measurement section 34 includes a magnetic field measurement section (for example, a Hall element or the like) for measuring the magnetic field strength of the electromagnet 34a and the magnetic field strength of the electromagnet 34a when the polarization axis angle $\theta_3$ of the demagnetization state becomes equal to the mean value $\theta_0$ is measured by the magnetic field measurement section to obtain the coercive force.

Although the first and second embodiments described above have described an example in which a continuously moving magnetic tape 10 is brought first into the negative-side magnetic saturation state and then into the positive-side magnetic saturation state, the magnetic tape 10 may be brought first into the positive-side magnetic saturation state and then into the positive-side magnetic saturation state. That is, the placement positions of the negative-side saturation magnetization measurement section 32 and the positive-side saturation magnetization measurement section 33 may be reversed.

Although the first and second embodiments described above have described a case where magnetic characteristics of a magnetic tape 10 of a perpendicular magnetic recording system are measured, it is also possible to measure magnetic characteristics of a magnetic tape 10 of a horizontal magnetic recording system (an in-plane magnetic recording system). In this case, each of the electromagnets 32a, 33a, and 34a is capable of applying an external magnetic field in the longitudinal direction of the magnetic tape 10. Note that the directions of application of the magnetic fields of the electromagnets 32a and 34a and the electromagnet 33a are opposite directions like in the first and second embodiments.

In the first and second embodiments described above, the PC 35 may feed a measurement result of magnetic characteristics (the coercive force, the squareness ratio, or the like) back to the film formation process. That is, the PC 35 may adjust a film formation condition for the magnetic layer 13, etc. on the basis of a measurement result of magnetic characteristics so that the magnetic characteristics of the magnetic tape 10 fall within a prescribed range.

More specifically, the PC 35 compares, on a real time basis, a measurement result of magnetic characteristics measured by the apparatus for measuring magnetic characteristic 30 or 30A with prescribed magnetic characteristics stored in the storage section of the PC 35, and makes feedback to the film formation process so that the magnetic characteristics fall within the range of the prescribed magnetic characteristics. That is, a film formation condition for the magnetic layer 13, etc. is adjusted so that the magnetic characteristics fall within the range of the prescribed magnetic characteristics. As the film formation condition to be adjusted, for example, at least one of the amount of the coating material 13a discharged (that is, the thickness of the magnetic layer 13), a drying condition for the coating material 13a, the magnetic field strength at the time of orienting the magnetic field, or the like is given. Specifically, for example, the squareness ratio can be changed by adjusting the magnetic field strength and adjusting the orientation state of the magnetic powder immediately after the application of the coating material 13a. Further, the amount of saturation magnetization can be adjusted by adjusting the thickness of the magnetic layer 13.

Although the first and second embodiments described above have described an example in which magnetic characteristics of a coating-type magnetic tape 10 in which a magnetic layer 13, etc. are produced by a coating process (a wet process) are measured, it is also possible to measure magnetic characteristics of a vacuum thin film-type magnetic tape in which a magnetic layer, etc. are produced by a technology for producing a vacuum thin film (a dry process). As the method for producing a vacuum thin film, for example, the sputtering method, the vapor deposition method, or the like is used, but the method is not limited to these.

Figure 10:
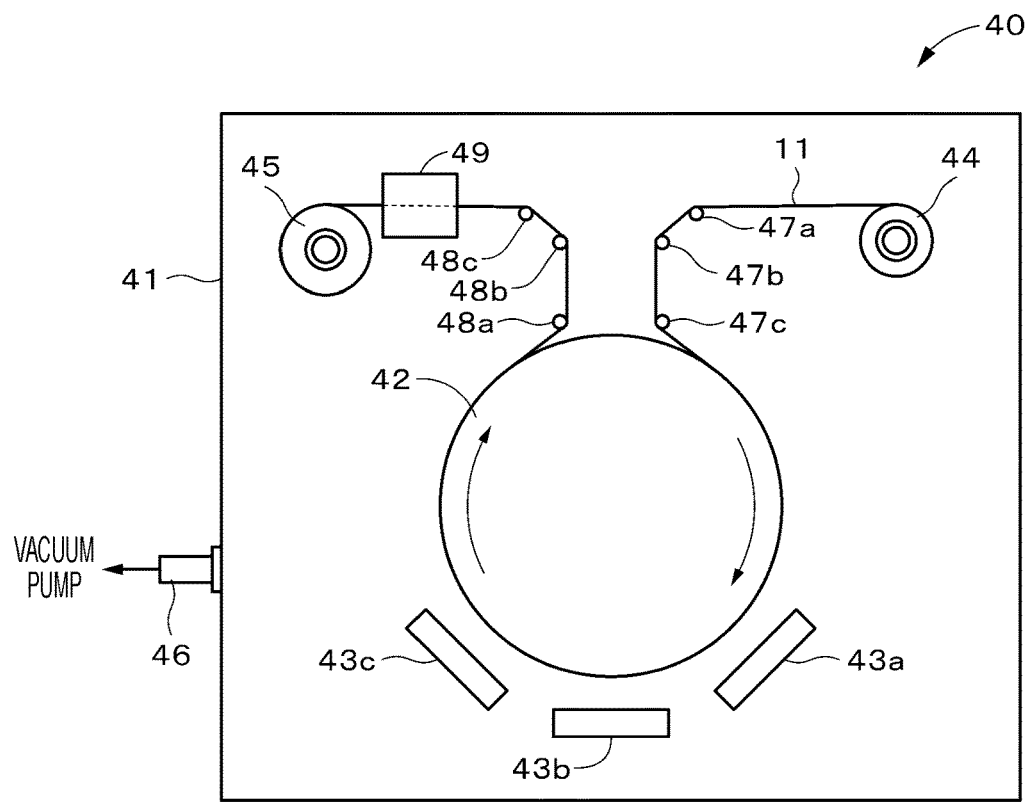
FIG. 10 is a schematic diagram showing a configuration of a film formation apparatus for magnetic tapes.

FIG. 10 shows a configuration of a film formation apparatus 40 for magnetic tapes that uses the sputtering method to perform film formation to obtain a magnetic layer, etc. The film formation apparatus 40 for magnetic tapes is a continuous winding-type sputtering apparatus used for the film formation of a seed layer, a ground layer, and a magnetic layer (a recording layer), and includes a film formation chamber 41, a drum 42 that is a metal can (a rotation body), cathodes 43a to 43c, a supply reel 44, a winding reel 45, a plurality of guide rolls 47a to 47c and 48a to 48c, and an apparatus for measuring magnetic characteristics 49. The film formation apparatus 40 is, for example, a sputtering apparatus of a direct current (DC) magnetron sputtering system, but the sputtering system is not limited to this system. The apparatus for measuring magnetic characteristics 49 is the apparatus for measuring magnetic characteristics 30 according to the first embodiment or the apparatus for measuring magnetic characteristics 30A according to the second embodiment. However, the PC 35, which is a control section, is placed outside the film formation apparatus 40 for magnetic tapes, and serves also as a control section that controls the film formation apparatus 40.

Although herein an example in which the film formation apparatus 40 includes three cathodes 43a to 43c is described, the number of cathodes is not limited to this, but may be one, two, or four or more. Further, although herein an example in which a seed layer and a ground layer are formed as films as sputtered layers other than the magnetic layer is described, at least one kind of layer of a soft magnetic backing layer (a SUL layer), an intermediate layer, etc. may be formed as a film in place of the seed layer and the ground layer or in combination with the seed layer and the ground layer.

The film formation chamber 41 is connected to a not-illustrated vacuum pump via an air outlet 46, and the atmosphere in the film formation chamber 41 is set at a prescribed degree of vacuum by the vacuum pump. The drum 42, the supply reel 44, and the winding reel 45, each of which has a rotatable configuration, are placed in the interior of the film formation chamber 41. In the interior of the film formation chamber 41, the plurality of guide rolls 47a to 47c for guiding the conveyance of the substrate 11 between the supply reel 44 and the drum 42 is provided, and further the plurality of guide rolls 48a to 48c for guiding the conveyance of the substrate 11 between the drum 42 and the winding reel 45 is provided. At the time of sputtering, the substrate 11 wound out from the supply reel 44 is wound around the winding reel 45 via the guide rolls 47a to 47c, the drum 42, and the guide rolls 48a to 48c. The drum 42 has a circular columnar shape, and the long-length substrate 11 is conveyed in agreement with the circular columnar circumferential surface of the drum 42. A not-illustrated cooling mechanism is provided in the drum 42, and performs cooling to, for example, approximately 20° C. at the time of sputtering. In the interior of the film formation chamber 41, the plurality of cathodes 43a to 43c is arranged facing the circumferential surface of the drum 42. A target is set in each of the cathodes 43a to 43c. Specifically, targets for forming a seed layer, a ground layer, and a magnetic layer as films are set in the cathodes 43a, 43b, and 43c, respectively. A plurality of kinds of films, that is, a seed layer, a ground layer, and a magnetic layer are simultaneously formed as films by the cathodes 43a to 43c.

The film formation apparatus 40 having the configuration described above can continuously form a seed layer, a ground layer, and a magnetic layer as films by a roll-to-roll method.

The PC 35 compares, on a real time basis, a measurement result of magnetic characteristics measured by the apparatus for measuring magnetic characteristic 49 with prescribed magnetic characteristics (for example, the holding force and the squareness ratio, or the like) stored in the storage section of the PC 35, and makes feedback to the film formation process so that the magnetic characteristics fall within the range of the prescribed magnetic characteristics. That is, a film formation condition for the magnetic layer 13, etc. is adjusted so that the magnetic characteristics fall within the range of the prescribed magnetic characteristics. As the film formation condition to be adjusted, for example, at least one of the sputtering electric power, the film running speed, the amount of gas introduced, the kind of gas introduced, the degree of vacuum, or the like is given. Specifically, for example, the coercive force and the squareness ratio can be changed by adjusting the degassing state in the film formation chamber 41. Note that, in a case where film formation is performed by a vapor deposition method, examples of the film formation condition to be adjusted include the strength of an electron beam, and the like.

Products falling within the range of process standard values can be continuously produced by providing the apparatus for measuring magnetic characteristics 49 in the film formation apparatus 40 for magnetic tapes, setting the range of the relevant magnetic characteristics narrower than the standard value range of the process, and performing feedback control as described above.

In the first embodiment described above, each of the negative-side saturation magnetization measurement section 32, the positive-side saturation magnetization measurement section 33, and the magnetization measurement section 34 may be provided facing the magnetic surface $10S_1$ of the magnetic tape 10, and may further include a reflecting mirror (a reflection section) that reflects, toward the magnetic surface $10S_1$, polarized light reflected at the magnetic surface $10S_1$. In this case, polarized light incident on the magnetic surface $10S_1$ is repeatedly reflected between the magnetic surface $10S_1$ and the reflecting mirror, that is, is reflected multiple times at the magnetic surface $10S_1$ of the magnetic tape 10, and is then received by the light receiving section $32c_2$, $33c_2$, or $34c_2$. Thus, changes of the light polarization state based on the magnetic Kerr effect can be accumulated. Therefore, the measurement sensitivity of the light polarization state can be improved.

Similarly, in the second embodiment described above, each of the negative-side saturation magnetization measurement section 32, the positive-side saturation magnetization measurement section 33, and the residual magnetization measurement section 36 may be provided facing the magnetic surface $10S_1$ of the magnetic tape 10, and may further include a reflecting mirror (a reflection section) that reflects, toward the magnetic surface $10S_1$, polarized light reflected at the magnetic surface $10S_1$.

Although the first and second embodiments described above have described a case where each of the negative-side saturation magnetization measurement section 32, the positive-side saturation magnetization measurement section 33, the magnetization measurement section 34, and the residual magnetization measurement section 36 measures a polarization axis angle as the light polarization state of reflected light, it is also possible to measure the ellipticity, the intensity of reflection, etc. instead of the polarization axis angle. In this case, ellipticity measurement circuits, reflection intensity measurement circuits, etc. are used in place of the polarization axis angle detection circuits $32c_3$, $33c_3$, $34c_3$, and $36c_3$.

In addition, the present disclosure may be configured by the following configuration.

(1)

A method for measuring magnetic characteristics, the method including: applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying a third magnetic field having an opposite direction of the second magnetic field to the continuously moving magnetic recording medium, applying a third polarized light to the surface of the magnetic recording medium to which the third magnetic field is being applied, and measuring a light polarization state of a third reflected light that is reflected; and adjusting a strength of the third magnetic field so that a measurement value of the light polarization state of the third reflected light is a mean value of a measurement value of the light polarization state of the first reflected light and a measurement value of the light polarization state of the second reflected light, and obtaining the strength of the third magnetic field when the measurement value of the light polarization state of the third reflected light becomes equal to the mean value.

(2)

The method for measuring magnetic characteristics according to (1), in which the magnetic recording medium is continuously moved in a direction going straight relative to a direction of each of the first magnetic field, the second magnetic field, and the third magnetic field.

(3)

The method for measuring magnetic characteristics according to (1) or (2), in which the measurement value of the light polarization state of the first reflected light, the measurement value of the light polarization state of the second reflected light, and the measurement value of the light polarization state of the third reflected light used to adjust the strength of the third magnetic field are acquired in the same position of the continuously moving magnetic recording medium.

(4)

The method for measuring magnetic characteristics according to any one of (1) to (3), in which each of the first polarized light, the second polarized light, and the third polarized light is reflected multiple times at the surface of the magnetic recording medium.

(5)

The method for measuring magnetic characteristics according to any one of (1) to (4), in which the light polarization state of the first reflected light, the light polarization state of the second reflected light, and the light polarization state of the third reflected light are a polarization axis angle of the first reflected light, a polarization axis angle of the second reflected light, and a polarization axis angle of the third reflected light, respectively.

(6)

An apparatus for measuring magnetic characteristics, the apparatus including:

a first measurement section configured to apply a first magnetic field to a continuously moving magnetic recording medium to magnetically saturate the magnetic recording medium, apply a first polarized light to a surface of the magnetic recording medium to which the first magnetic field is being applied, and measure a light polarization state of a first reflected light that is reflected;

a second measurement section configured to apply a second magnetic field having an opposite direction of the first magnetic field to the continuously moving magnetic recording medium to magnetically saturate the magnetic recording medium, apply a second polarized light to the surface of the magnetic recording medium to which the second magnetic field is being applied, and measure a light polarization state of a second reflected light that is reflected;

a third measurement section configured to apply a third magnetic field having an opposite direction of the second magnetic field to the continuously moving magnetic recording medium, apply a third polarized light to the surface of the magnetic recording medium to which the third magnetic field is being applied, and measure a light polarization state of a third reflected light that is reflected; and a control section configured to control the third measurement section to adjust a strength of the third magnetic field so that a measurement value of the light polarization state of the third reflected light is a mean value of a measurement value of the light polarization state of the first reflected light and a measurement value of the light polarization state of the second reflected light, and obtain the strength of the third magnetic field when the measurement value of the light polarization state of the third reflected light becomes equal to the mean value.

(7)

The apparatus for measuring magnetic characteristics according to (6), the apparatus further including: a conveyance section configured to continuously move the magnetic recording medium in a direction going straight relative to a direction of each of the first magnetic field, the second magnetic field, and the third magnetic field.

(8)

The apparatus for measuring magnetic characteristics according to (6) or (7), in which the control section adjusts the strength of the third magnetic field by using the measurement value of the light polarization state of the first reflected light, the measurement value of the light polarization state of the second reflected light, and the measurement value of the light polarization state of the third reflected light that are acquired in the same position of the continuously moving magnetic recording medium.

(9)

The apparatus for measuring magnetic characteristics according to any one of (6) to (8), the apparatus further including: reflection sections provided facing the surface of the magnetic recording medium, in which the first polarized light, the second polarized light, and the third polarized light are repeatedly reflected between the surface of the magnetic recording medium and the reflection sections.

(10)

The apparatus for measuring magnetic characteristics according to any one of (6) to (9), in which the third measurement section includes a magnetic field measurement section configured to measure the strength of the third magnetic field, and the control section uses the magnetic field measurement section to measure the strength of the third magnetic field when the measurement value of the light polarization state of the third reflected light becomes equal to the mean value.

(11)

The apparatus for measuring magnetic characteristics according to any one of (6) to (9), in which the third measurement section includes a magnetic field generation section configured to apply the third magnetic field to the continuously moving magnetic recording medium, the control section adjusts the strength of the third magnetic field by controlling a value of current to be supplied to the magnetic field generation section, and the control section converts the value of current that is supplied to the magnetic field generation section when the measurement value of the light polarization state of the third reflected light becomes equal to the mean value to a strength of a magnetic field, and calculates the strength of the third magnetic field when the measurement value of the light polarization state of the third reflected light became equal to the mean value.

(12)

The apparatus for measuring magnetic characteristics according to any one of (6) to (11), in which the light polarization state of the first reflected light, the light polarization state of the second reflected light, and the light polarization state of the third reflected light are a polarization axis angle of the first reflected light, a polarization axis angle of the second reflected light, and a polarization axis angle of the third reflected light, respectively.

(13)

A method for manufacturing a magnetic recording medium, the method including:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying a third magnetic field having an opposite direction of the second magnetic field to the continuously moving magnetic recording medium, applying a third polarized light to the surface of the magnetic recording medium to which the third magnetic field is being applied, and measuring a light polarization state of a third reflected light that is reflected;

adjusting a strength of the third magnetic field so that a measurement value of the light polarization state of the third reflected light is a mean value of a measurement value of the light polarization state of the first reflected light and a measurement value of the light polarization state of the second reflected light, and obtaining, as a coercive force, the strength of the third magnetic field when the measurement value of the light polarization state of the third reflected light becomes equal to the mean value; and adjusting a film formation condition for the continuously moving magnetic recording medium on the basis of the coercive force obtained.

(14)

A method for measuring magnetic characteristics, the method including:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying light to the surface of the continuously moving magnetic recording medium, and measuring a light polarization state of a third reflected light that is reflected; and calculating a ratio ($\Delta A_{20}/\Delta A_{10}$) of a difference $\Delta A_{20}$ ($=A_2-A_0$) between a mean value $A_0$ of measurement values of the light polarization states of the first reflected light and the second reflected light and a measurement value $A_2$ of the light polarization state of the third reflected light to a difference $\Delta A_{10}$ ($=A_1-A_0$) between the mean value $A_0$ and the measurement value $A_1$ of the light polarization state of the first reflected light.

(15)

An apparatus for measuring magnetic characteristics, the apparatus including:

a first measurement section configured to apply a first magnetic field to a continuously moving magnetic recording medium to magnetically saturate the magnetic recording medium, apply a first polarized light to a surface of the magnetic recording medium to which the first magnetic field is being applied, and measure a light polarization state of a first reflected light that is reflected;

a second measurement section configured to apply a second magnetic field having an opposite direction of the first magnetic field to the continuously moving magnetic recording medium to magnetically saturate the magnetic recording medium, apply a second polarized light to the surface of the magnetic recording medium to which the second magnetic field is being applied, and measure a light polarization state of a second reflected light that is reflected;

a third measurement section configured to apply light to the surface of the continuously moving magnetic recording medium, and measure a light polarization state of a third reflected light that is reflected; and an arithmetic section configured to calculate a ratio $(\Delta A_{20}/\Delta A_{10})$ of a difference $\Delta A_{20}$ $(=A_2-A_0)$ between a mean value $A_0$ of measurement values of the light polarization states of the first reflected light and the second reflected light and a measurement value $A_2$ of the light polarization state of the third reflected light to a difference $\Delta A_{10}$ $(=A_1-A_0)$ between the mean value $A_0$ and the measurement value $A_1$ of the light polarization state of the first reflected light.

(16) A method for manufacturing a magnetic recording medium, the method including:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying light to the surface of the continuously moving magnetic recording medium, and measuring a light polarization state of a third reflected light that is reflected;

obtaining a squareness ratio by calculating a ratio $(\Delta A_{20}/\Delta A_{10})$ of a difference $\Delta A_{20}$ $(=A_2-A_0)$ between a mean value $A_0$ of measurement values of the light polarization states of the first reflected light and the second reflected light and a measurement value $A_2$ of the light polarization state of the third reflected light to a difference $\Delta A_{10}$ $(=A_1-A_0)$ between the mean value $A_0$ and the measurement value $A_1$ of the light polarization state of the first reflected light; and adjusting a film formation condition for the continuously moving magnetic recording medium on the basis of the squareness ratio obtained.

REFERENCE SIGNS LIST

10 Magnetic tape
$10S_1$ Magnetic surface
$10S_2$ Back surface
11 Substrate
12 Ground layer
13 Magnetic layer
13a Coating material
14 Back layer
20, 40 Film formation apparatus
21, 22 Roll
23 Film formation head
24 Drying furnace
30, 30A Apparatus for measuring magnetic characteristics
31 Guide roll (conveyance section)
31a Encoder
32 Positive-side saturation magnetization measurement section (first measurement section)
33 Negative-side saturation magnetization measurement section (second measurement section)
34 Magnetization measurement section (third measurement section)
35 PC (control section and arithmetic section)
36 Residual magnetization measurement section (third measurement section)
32a, 33a, 34a Electromagnet (magnetic field generation section)
32b, 33b, 34b Power source
32c, 33c, 34c, 36c Light polarization detection section
$32c_1$, $33c_1$, $34c_1$, $36c_1$ Irradiation section
$32c_2$, $33c_2$, $34c_2$, $36c_2$ Light receiving section
$32c_3$, $33c_3$, $34c_3$, $36c_3$ Polarization axis angle detection circuit

The invention claimed is:

1. A method for measuring magnetic characteristics, the method comprising:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying a third magnetic field having an opposite direction of the second magnetic field to the continuously moving magnetic recording medium, applying a third polarized light to the surface of the magnetic recording medium to which the third magnetic field is being applied, and measuring a light polarization state of a third reflected light that is reflected; and adjusting a strength of the third magnetic field so that a measurement value of the light polarization state of the third reflected light is a mean value of a measurement value of the light polarization state of the first reflected light and a measurement value of the light polarization state of the second reflected light, and obtaining the strength of the third magnetic field when the measurement value of the light polarization state of the third reflected light becomes equal to the mean value.

2. The method for measuring magnetic characteristics according to claim 1, wherein the magnetic recording medium is continuously moved in a direction going straight relative to a direction of each of the first magnetic field, the second magnetic field, and the third magnetic field.

3. The method for measuring magnetic characteristics according to claim 1, wherein the measurement value of the light polarization state of the first reflected light, the measurement value of the light polarization state of the second reflected light, and the measurement value of the light polarization state of the third reflected light used to adjust the strength of the third magnetic field are acquired in the same position of the continuously moving magnetic recording medium.

4. The method for measuring magnetic characteristics according to claim 1, wherein each of the first polarized light, the second polarized light, and the third polarized light is reflected multiple times at the surface of the magnetic recording medium.

5. The method for measuring magnetic characteristics according to claim 1, wherein the light polarization state of the first reflected light, the light polarization state of the second reflected light, and the light polarization state of the third reflected light are a polarization axis angle of the first reflected light, a polarization axis angle of the second reflected light, and a polarization axis angle of the third reflected light, respectively.

6. An apparatus for measuring magnetic characteristics, the apparatus comprising:
a first measurement section configured to apply a first magnetic field to a continuously moving magnetic recording medium to magnetically saturate the magnetic recording medium, apply a first polarized light to a surface of the magnetic recording medium to which the first magnetic field is being applied, and measure a light polarization state of a first reflected light that is reflected;
a second measurement section configured to apply a second magnetic field having an opposite direction of the first magnetic field to the continuously moving magnetic recording medium to magnetically saturate the magnetic recording medium, apply a second polarized light to the surface of the magnetic recording medium to which the second magnetic field is being applied, and measure a light polarization state of a second reflected light that is reflected;
a third measurement section configured to apply a third magnetic field having an opposite direction of the second magnetic field to the continuously moving magnetic recording medium, apply a third polarized light to the surface of the magnetic recording medium to which the third magnetic field is being applied, and measure a light polarization state of a third reflected light that is reflected; and
a control section configured to control the third measurement section to adjust a strength of the third magnetic field so that a measurement value of the light polarization state of the third reflected light is a mean value of a measurement value of the light polarization state of the first reflected light and a measurement value of the light polarization state of the second reflected light, and obtain the strength of the third magnetic field when the measurement value of the light polarization state of the third reflected light becomes equal to the mean value.

7. The apparatus for measuring magnetic characteristics according to claim 6, the apparatus further comprising: a conveyance section configured to continuously move the magnetic recording medium in a direction going straight relative to a direction of each of the first magnetic field, the second magnetic field, and the third magnetic field.

8. The apparatus for measuring magnetic characteristics according to claim 6, wherein the control section adjusts the strength of the third magnetic field by using the measurement value of the light polarization state of the first reflected light, the measurement value of the light polarization state of the second reflected light, and the measurement value of the light polarization state of the third reflected light that are acquired in the same position of the continuously moving magnetic recording medium.

9. The apparatus for measuring magnetic characteristics according to claim 6, the apparatus further comprising: reflection sections provided facing the surface of the magnetic recording medium,
wherein the first polarized light, the second polarized light, and the third polarized light are repeatedly reflected between the surface of the magnetic recording medium and the reflection sections.

10. The apparatus for measuring magnetic characteristics according to claim 6, wherein the third measurement section includes a magnetic field measurement section configured to measure the strength of the third magnetic field, and
the control section uses the magnetic field measurement section to measure the strength of the third magnetic field when the measurement value of the light polarization state of the third reflected light becomes equal to the mean value.

11. The apparatus for measuring magnetic characteristics according to claim 6, wherein the third measurement section includes a magnetic field generation section configured to apply the third magnetic field to the continuously moving magnetic recording medium,
the control section adjusts the strength of the third magnetic field by controlling a value of current to be supplied to the magnetic field generation section, and
the control section converts the value of current that is supplied to the magnetic field generation section when the measurement value of the light polarization state of the third reflected light becomes equal to the mean value to a strength of a magnetic field, and calculates the strength of the third magnetic field when the measurement value of the light polarization state of the third reflected light became equal to the mean value.

12. The apparatus for measuring magnetic characteristics according to claim 6, wherein the light polarization state of the first reflected light, the light polarization state of the second reflected light, and the light polarization state of the third reflected light are a polarization axis angle of the first reflected light, a polarization axis angle of the second reflected light, and a polarization axis angle of the third reflected light, respectively.

13. A method for manufacturing a magnetic recording medium, the method comprising:
applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;
applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying a third magnetic field having an opposite direction of the second magnetic field to the continuously moving magnetic recording medium, applying a third polarized light to the surface of the magnetic recording medium to which the third magnetic field is being applied, and measuring a light polarization state of a third reflected light that is reflected;

adjusting a strength of the third magnetic field so that a measurement value of the light polarization state of the third reflected light is a mean value of a measurement value of the light polarization state of the first reflected light and a measurement value of the light polarization state of the second reflected light, and obtaining, as a coercive force, the strength of the third magnetic field when the measurement value of the light polarization state of the third reflected light becomes equal to the mean value; and adjusting a film formation condition for the continuously moving magnetic recording medium on a basis of the coercive force obtained.

14. A method for measuring magnetic characteristics, the method comprising:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying light to the surface of the continuously moving magnetic recording medium, and measuring a light polarization state of a third reflected light that is reflected; and calculating a ratio ($\Delta A_{20}/\Delta A_{10}$) of a difference $\Delta A_{20}$ ($=A_2-A_0$) between a mean value $A_0$ of measurement values of the light polarization states of the first reflected light and the second reflected light and a measurement value $A_2$ of the light polarization state of the third reflected light to a difference $\Delta A_{10}$ ($=A_1-A_0$) between the mean value $A_0$ and the measurement value $A_1$ of the light polarization state of the first reflected light.

15. An apparatus for measuring magnetic characteristics, the apparatus comprising:

a first measurement section configured to apply a first magnetic field to a continuously moving magnetic recording medium to magnetically saturate the magnetic recording medium, apply a first polarized light to a surface of the magnetic recording medium to which the first magnetic field is being applied, and measure a light polarization state of a first reflected light that is reflected;

a second measurement section configured to apply a second magnetic field having an opposite direction of the first magnetic field to the continuously moving magnetic recording medium to magnetically saturate the magnetic recording medium, apply a second polarized light to the surface of the magnetic recording medium to which the second magnetic field is being applied, and measure a light polarization state of a second reflected light that is reflected;

a third measurement section configured to apply light to the surface of the continuously moving magnetic recording medium, and measure a light polarization state of a third reflected light that is reflected; and an arithmetic section configured to calculate a ratio ($\Delta A_{20}/\Delta A_{10}$) of a difference $\Delta A_{20}$ ($=A_2-A_0$) between a mean value $A_0$ of measurement values of the light polarization states of the first reflected light and the second reflected light and a measurement value $A_2$ of the light polarization state of the third reflected light to a difference $\Delta A_{10}$ ($=A_1-A_0$) between the mean value $A_0$ and the measurement value $A_1$ of the light polarization state of the first reflected light.

16. A method for manufacturing a magnetic recording medium, the method comprising:

applying a first magnetic field to a continuously moving magnetic recording medium to magnetically saturate the magnetic recording medium, applying a first polarized light to a surface of the magnetic recording medium to which the first magnetic field is being applied, and measuring a light polarization state of a first reflected light that is reflected;

applying a second magnetic field having an opposite direction of the first magnetic field to the continuously moving magnetic recording medium to magnetically saturate the magnetic recording medium, applying a second polarized light to the surface of the magnetic recording medium to which the second magnetic field is being applied, and measuring a light polarization state of a second reflected light that is reflected;

applying light to the surface of the continuously moving magnetic recording medium, and measuring a light polarization state of a third reflected light that is reflected;

obtaining a squareness ratio by calculating a ratio ($\Delta A_{20}/\Delta A_{10}$) of a difference $\Delta A_{20}$ ($=A_2-A_0$) between a mean value $A_0$ of measurement values of the light polarization states of the first reflected light and the second reflected light and a measurement value $A_2$ of the light polarization state of the third reflected light to a difference $\Delta A_{10}$ ($=A_1-A_0$) between the mean value $A_0$ and the measurement value $A_1$ of the light polarization state of the first reflected light; and adjusting a film formation condition for the continuously moving magnetic recording medium on a basis of the squareness ratio obtained.

\* \* \* \* \*